United States Patent
Liu et al.

(10) Patent No.: US 12,387,803 B2
(45) Date of Patent: Aug. 12, 2025

(54) DYNAMIC BITSCAN FOR NON-VOLATILE MEMORY

(71) Applicant: Western Digital Technologies, Inc., San Jose, CA (US)

(72) Inventors: Yidan Liu, Shanghai (CN); Liang Li, Shanghai (CN); Chao Xu, Shanghai (CN); Yingying Zhu, Shanghai (CN)

(73) Assignee: Sandisk Technologies, Inc., Milpitas, CA (US)

( * ) Notice: Subject to any disclaimer, the term of this patent is extended or adjusted under 35 U.S.C. 154(b) by 264 days.

(21) Appl. No.: 18/360,487

(22) Filed: Jul. 27, 2023

(65) Prior Publication Data
US 2024/0404607 A1 Dec. 5, 2024

Related U.S. Application Data

(60) Provisional application No. 63/505,284, filed on May 31, 2023.

(51) Int. Cl.
*G11C 16/34* (2006.01)
*G11C 16/04* (2006.01)
*G11C 16/10* (2006.01)

(52) U.S. Cl.
CPC ...... *G11C 16/3459* (2013.01); *G11C 16/0433* (2013.01); *G11C 16/102* (2013.01)

(58) Field of Classification Search
CPC ............ G11C 16/3459; G11C 16/0433; G11C 16/102
USPC .................................................... 365/185.22
See application file for complete search history.

(56) References Cited

U.S. PATENT DOCUMENTS

| | | | |
|---|---|---|---|
| 7,394,700 B2 | 7/2008 | Park et al. |
| 8,228,741 B2 | 7/2012 | Li et al. |
| 8,400,836 B2 | 3/2013 | Li et al. |
| 8,446,776 B2 | 5/2013 | Hwang et al. |
| 8,599,613 B2 | 12/2013 | Abiko et al. |
| 9,552,882 B2 | 1/2017 | Tseng et al. |
| 9,852,078 B2 | 12/2017 | Zaitsu et al. |
| 10,014,063 B2 | 7/2018 | Tseng et al. |
| 10,297,337 B2 | 5/2019 | Tsai et al. |
| 10,535,401 B2 | 1/2020 | Lin et al. |
| 11,468,950 B1 | 10/2022 | Prakash et al. |
| 11,521,686 B2 | 12/2022 | Lien et al. |
| 11,587,629 B2 | 2/2023 | Zhang et al. |

(Continued)

*Primary Examiner* — Amir Zarabian
*Assistant Examiner* — Daniel J King
(74) *Attorney, Agent, or Firm* — Pearl Cohen Zedek Latzer Baratz LLP

(57) ABSTRACT

Technology is disclosed herein for a dynamic bitscan. The dynamic bitscan may include performing a first bitscan of a first strict subset of memory cells. Then, based on results of the first bitscan, a determination is made whether to perform a second bitscan of a second strict subset of memory cells. Prior to the bitscan(s) a verify reference voltage may be applied to both strict subsets of memory cells. Skipping the second bitscan saves considerable time. However, the second bitscan is performed at least sometimes, which increases accuracy. The first strict subset of memory cells and the second strict subset of memory cells may have different locations relative to some point in the block that contains the memory cells. The first strict subset of memory cells and the second strict subset may have different programming speeds.

20 Claims, 23 Drawing Sheets

(56) References Cited

U.S. PATENT DOCUMENTS

| | | | |
|---|---|---|---|
| 2012/0072806 A1 | 3/2012 | Tabata et al. | |
| 2021/0407605 A1* | 12/2021 | Lien | H10B 41/10 |
| 2022/0165341 A1* | 5/2022 | Pitner | G11C 16/14 |
| 2022/0208287 A1* | 6/2022 | Petkar | G11C 16/3459 |
| 2022/0406342 A1 | 12/2022 | Lu et al. | |

* cited by examiner

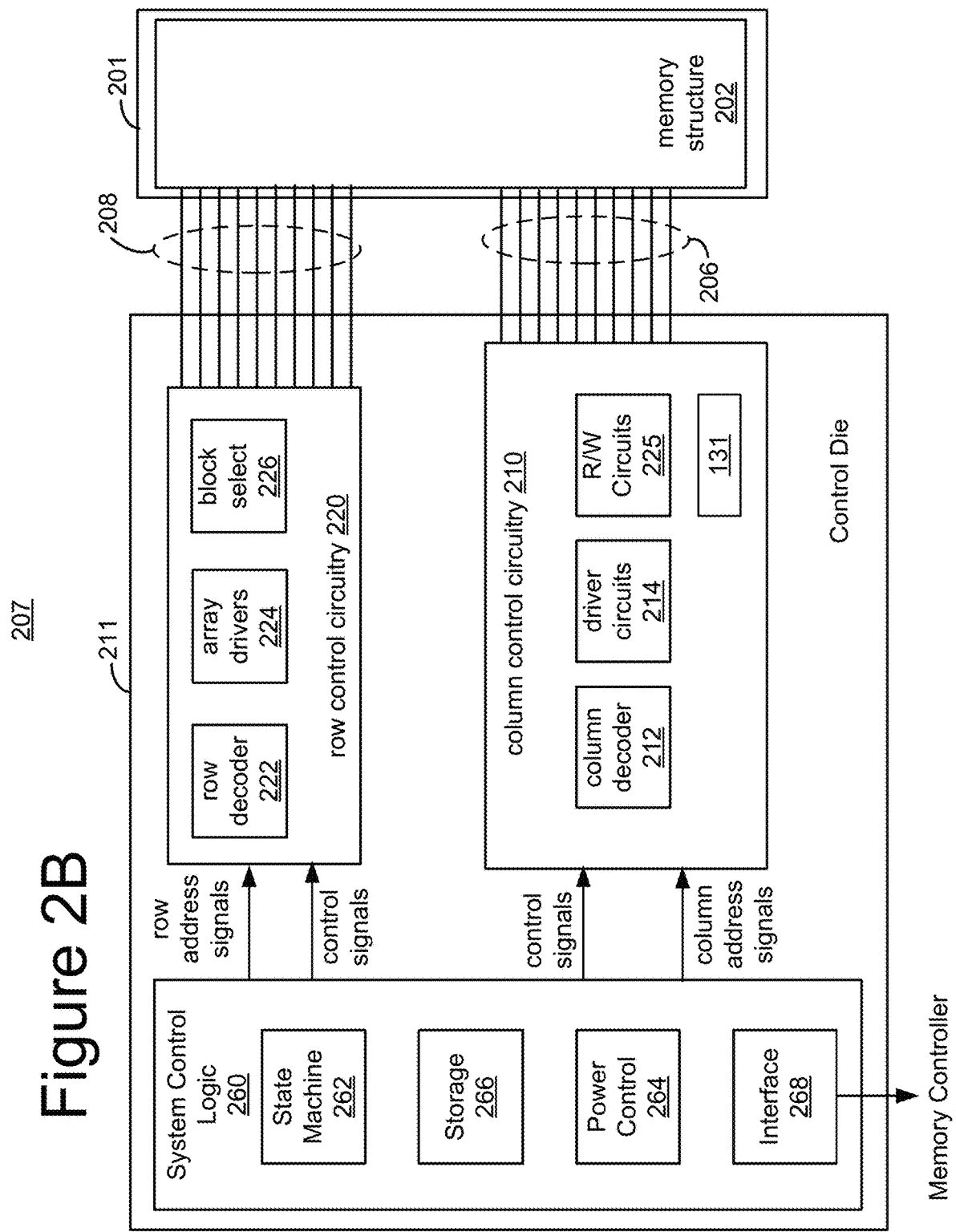

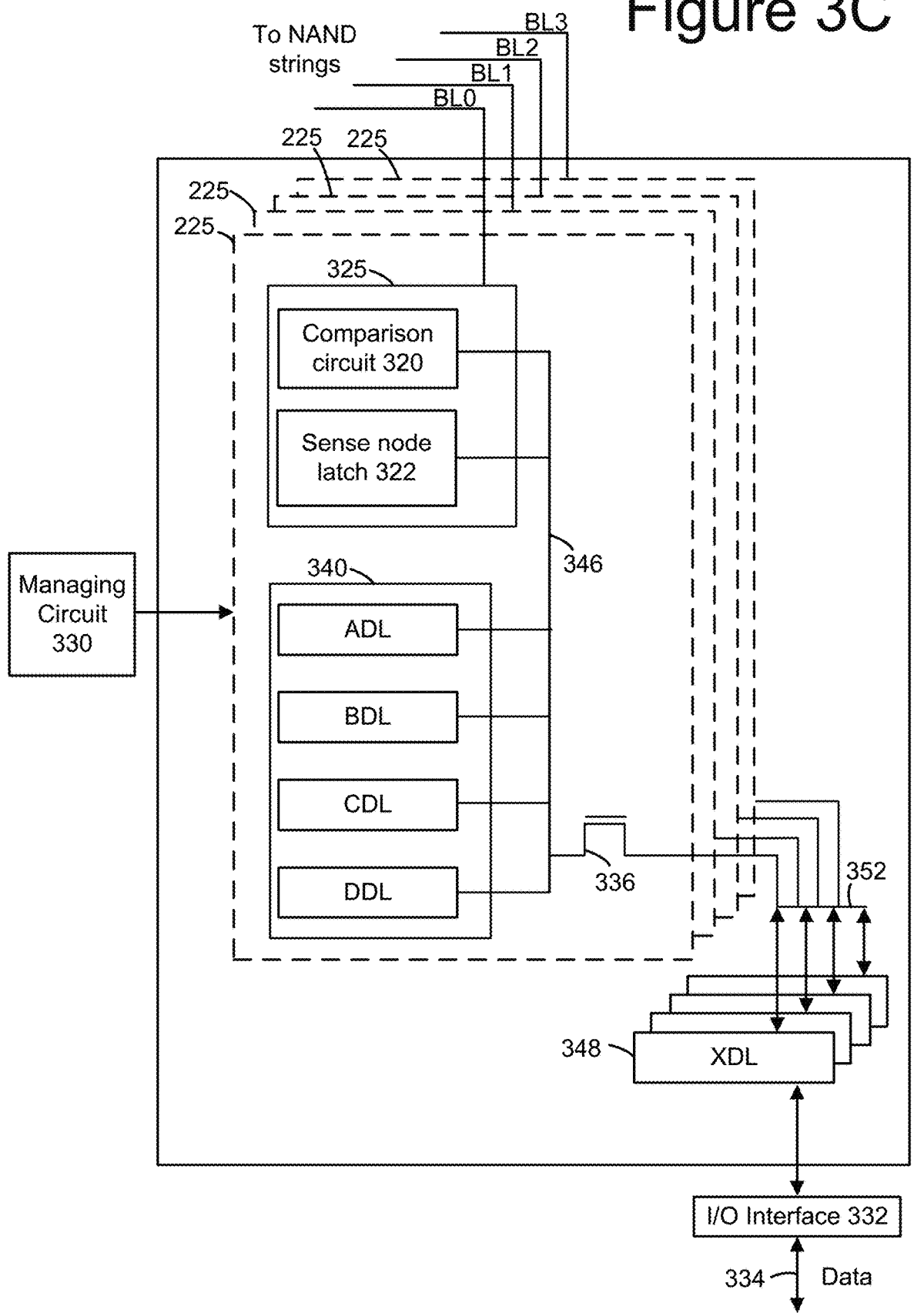

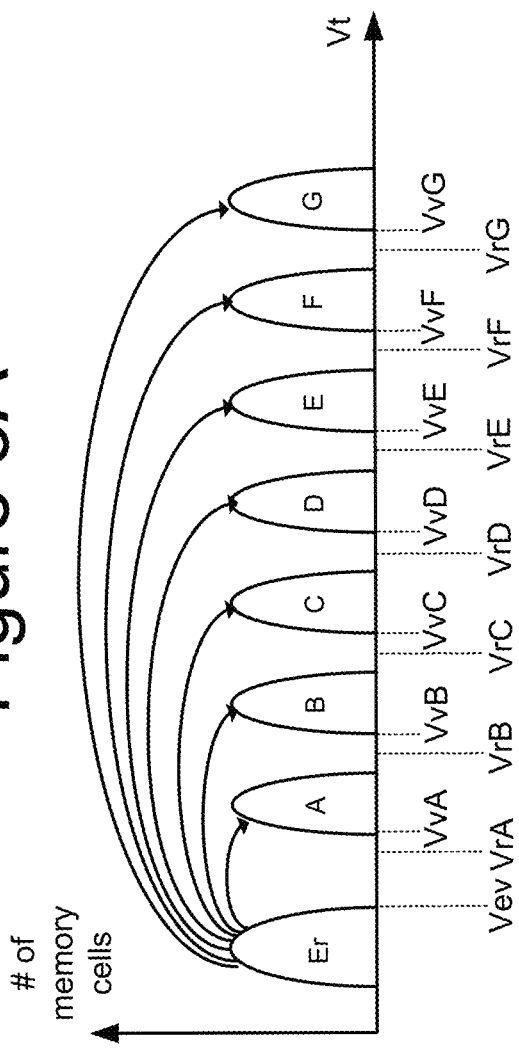

US 12,387,803 B2

DYNAMIC BITSCAN FOR NON-VOLATILE MEMORY

CLAIM OF PRIORITY

The present application claims priority from U.S. Provisional Patent Application No. 63/505,284, entitled "DYNAMIC BITSCAN FOR NON-VOLATILE MEMORY," by Liu et al., filed May 31, 2023, incorporated by reference herein in its entirety.

BACKGROUND

The present disclosure relates to non-volatile memory.

Semiconductor memory is widely used in various electronic devices such as cellular telephones, digital cameras, personal digital assistants, medical electronics, mobile computing devices, servers, solid state drives, non-mobile computing devices and other devices. Semiconductor memory may comprise non-volatile memory or volatile memory. Non-volatile memory allows information to be stored and retained even when the non-volatile memory is not connected to a source of power (e.g., a battery).

A memory structure in the memory system typically contains many memory cells and various control lines. The memory structure may be arranged into units that are referred to as blocks. For example, a block in a NAND memory system contains many NAND strings. A NAND string contains memory cell transistors connected in series, a drain side select gate at one end, and a source side select gate at the other end. Each select gate may have one or more transistors in series. Each NAND string is associated with a bit line. The block typically has many word lines that provide voltages to the control gates of the memory cell transistors. In some architectures, each word line connects to the control gate of one memory cell on each respective NAND string in the block.

The memory structure may be three-dimensional (3D). One type of 3D structure has non-volatile memory cells arranged as vertical NAND strings. One type of three-dimensional memory structure has alternating dielectric layers and conductive layers in a stack. NAND strings are formed vertically in the alternating dielectric layers and conductive layers in what may be referred to as memory holes. For example, after memory holes are drilled into the stack of alternating layers of two different materials, the memory holes are filled in with layers of materials including a charge-trapping material to create a vertical column of memory cells (e.g., NAND string).

The semiconductor fabrication process for forming a three-dimensional memory structure may result in location dependent physical differences between similar structures. There may be significant physical variations between different regions of the memory structure due to, for example, variations in the manufacturing process. For example, there could be variations in the thickness of dielectric layers, memory hole material layers, etc. Such physical variations can impact memory operations including, but not limited to, program and verify.

The memory cells are programmed one group at a time. The unit of programming is typically referred to as a page. Typically, the memory cells are programmed to a number of data states. Using a greater number of data states allows for more bits to be stored per memory cell. For example, four data states may be used to store two bits per memory cell, eight data states may be used in order to store three bits per memory cell, 16 data states may be used to store four bits per memory cell, etc. Some memory cells may be programmed to a data state by storing charge in the memory cell. For example, the threshold voltage (Vt) of a NAND memory cell can be set to a target Vt by programming charge into a charge storage region such as a charge trapping layer. The amount of charge stored in the charge trapping layer establishes the Vt of the memory cell.

The programming process typically includes multiple program loops, wherein each program loop includes applying a program pulse followed by verifying one or more of the data states. Verifying for a given data state includes testing whether memory cells that are targeted for that data state have a Vt at or above a verify reference voltage for that data state. Verifying may include counting how many memory cells that are targeted for the data state but still have a Vt below the verify reference voltage for that data state. The process of counting the number of such memory cells is referred to as a bitscan. Performing a bitscan can take a substantial amount of time. The verification process adds considerable time to the programming process; therefore, saving time during verify can significantly reduce the time needed to complete programming.

BRIEF DESCRIPTION OF THE DRAWINGS

Like-numbered elements refer to common components in the different figures.

FIG. 2B is a block diagram of one embodiment of an integrated memory assembly.

FIG. 3C is a block diagram depicting one embodiment of a portion of column control circuitry that contains a number of read/write circuits.

FIG. 5A depicts a threshold voltage (Vt) distributions when each memory cells stores three bits.

FIG. 5B depicts a threshold voltage (Vt) distributions when each memory cells stores four bits.

DETAILED DESCRIPTION

Figure 1:
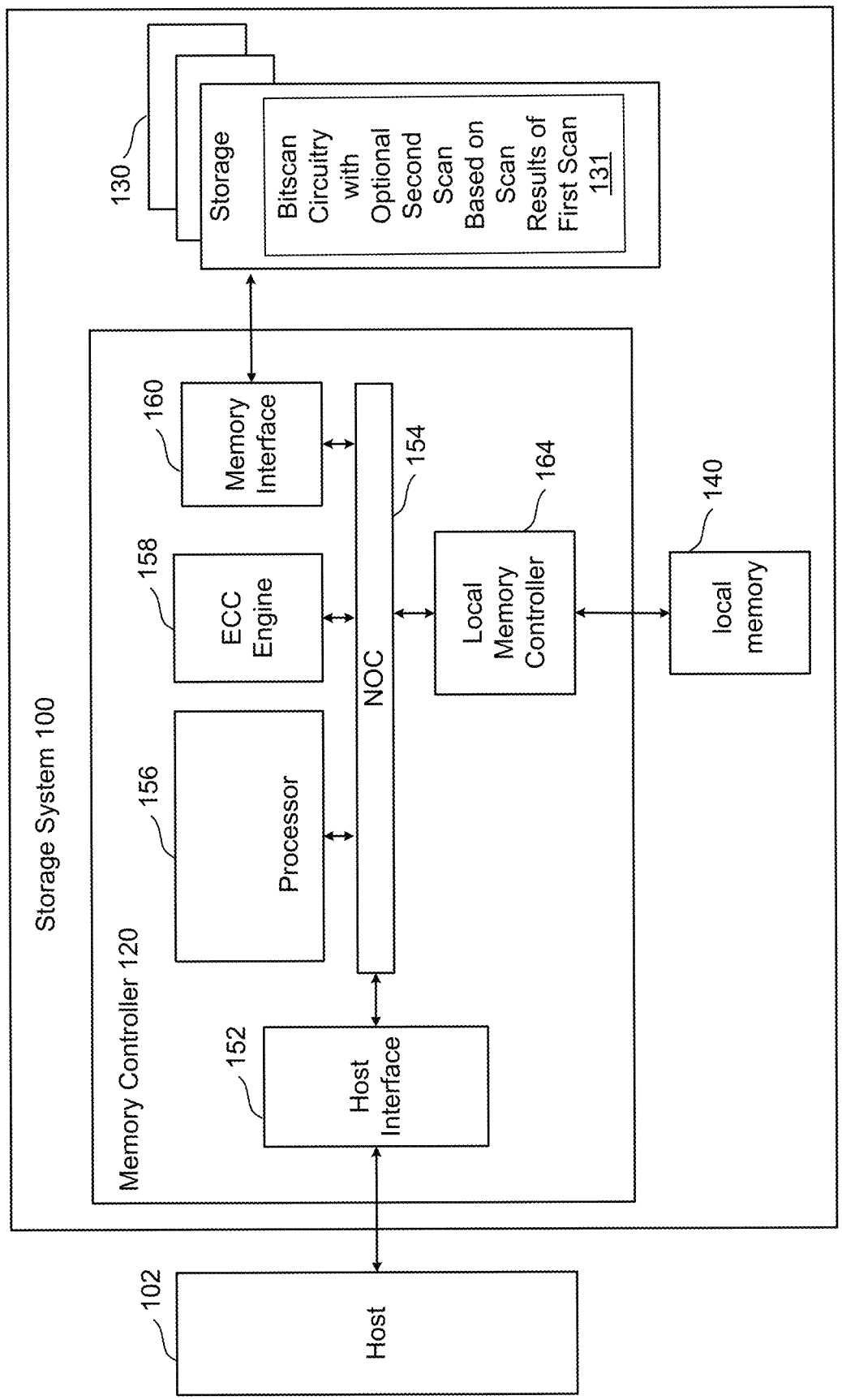
FIG. 1 is a block diagram depicting one embodiment of a storage system.

Technology is disclosed herein for a dynamic bitscan. An embodiment of the dynamic bitscan includes performing a first bitscan of a first strict subset of memory cells. Then, based on results of the first bitscan, a determination is made whether to perform a second bitscan of a second strict subset of memory cells. In an embodiment, the first strict subset and the second strict subset are disjoint sets. Prior to the bitscan(s) a verify reference voltage may be applied to both strict subsets of memory cells. In one embodiment, the bitscan(s) count how many cells have a Vt below the verify reference voltage. In one embodiment, the bitscan(s) count how many cells have a Vt above the verify reference voltage. Skipping the second bitscan saves considerable time. In one embodiment, the second bitscan is skipped if the count in the first bitscan meets a criterion. The criterion may be chosen such that the second bitscan is skipped if the result of the first bitscan indicates that the likelihood of the second bitscan providing useful information is low.

For purposes of this document, the term "set" of elements refers to a "set" of one or more of the elements. For purposes of this document, the term "subset" refers to a portion of a set that includes at least one element of the set. A "subset" may include all elements in the set. For purposes of this document, the term "strict subset" refers to a portion of a set that includes at least one element of the set but does not include all elements of the set. That is, if set A is a strict subset of set B, then there exists at least one element in set B that is not an element in set A. The term "formal subset" may also be used for "strict subset". For purposes of this document, the term "disjoint sets" means two or more sets that have no elements in common.

In some embodiments, the first strict subset of memory cells and the second strict subset of memory cells have different locations relative to some point in the block that contains the memory cells. For example, one strict subset of memory cells may be "outer memory cells" that are nearer an edge of the block and the other strict subset may be "inner memory cells" that are further from the edge of the block. The different locations may result in different physical characteristics between the two strict subsets of cells. In one embodiment, the two strict subsets of cells program at different speeds. Briefly, the programming speed refers to how much a memory cell's Vt increases due to application of program pulse. In one embodiment, one strict subset of memory cells contains faster programming cells and the other strict subset contains slower programming cells. Strategically ordering the bitscans based on programming speed can increase the chance that the second bitscan is skipped, thereby reducing programming time. However, the second bitscan is still performed at least on some occasions, which provides for overall accuracy of the bitscan(s).

In one embodiment, the bitscan(s) are used for program verify. In an embodiment in which the bitscan(s) are used for program verify slower programming cells are the subject of the first bitscan with the faster programming cells being the subject of the potential second bitscan. Placing the slower programming cells in the first bitscan may increase the likelihood of a fail status for the first program verify bitscan, in which case the second program verify bitscan may be skipped. Therefore, placing the slower programming cells in the first program verify bitscan may increase the likelihood of skipping the second program verify bitscan thereby saving time.

In one embodiment, the bitscan is used for smart program count before verify (SPCV). SPCV is a technique that determines whether verify of state n+p should begin based on verification of state n (where n and p are each integers greater than zero). In one embodiment, the test is whether a certain number of cells have a Vt above a verify reference voltage for state n. In one embodiment in which the bitscan is used for SPCV, the faster programming cells are the subject of the first SPCV bitscan with the slower programming cells being the subject of the potential second SPCV bitscan. Placing the faster programming cells in the first bitscan may increase the likelihood of a pass status for the first SPCV bitscan, in which case the second SPCV bitscan may be skipped. Therefore, placing the faster programming cells in the first SPCV bitscan may increase the likelihood of skipping the second SPCV bitscan thereby saving time.

FIG. 1 is a block diagram of one embodiment of a storage system 100 that implements the technology described herein. The storage system 100 is configured to implement embodiments of dynamic bitscan as disclosed herein. In one embodiment, storage system 100 is a solid state drive ("SSD"). Storage system 100 may be referred to as a "non-volatile storage system." Storage system 100 can also be a memory card, USB drive or other type of storage system. The proposed technology is not limited to any one type of storage system. Storage system 100 is connected to host 102, which can be a computer, server, electronic device (e.g., smart phone, tablet or other mobile device), appliance, or another apparatus that uses memory and has data processing capabilities. In some embodiments, host 102 is separate from, but connected to, storage system 100. In other embodiments, storage system 100 is embedded within host 102.

The components of storage system 100 depicted in FIG. 1 are electrical circuits. Storage system 100 includes a memory controller 120 (or storage controller) connected to non-volatile storage 130 and local high speed memory 140 (e.g., DRAM, SRAM, MRAM). Local memory 140 is non-transitory memory, which may include volatile memory or non-volatile memory. Local high speed memory 140 is used by memory controller 120 to perform certain operations. For example, local high speed memory 140 may store logical to physical address translation tables ("L2P tables").

Memory controller 120 comprises a host interface 152 that is connected to and in communication with host 102. In one embodiment, host interface 152 implements an NVM Express (NVMe) over PCI Express (PCIe). Other interfaces can also be used, such as SCSI, SATA, etc. Host interface 152 is also connected to a network-on-chip (NOC) 154. A NOC is a communication subsystem on an integrated circuit. NOC's can span synchronous and asynchronous clock domains or use unclocked asynchronous logic. NOC technology applies networking theory and methods to on-chip communications and brings notable improvements over conventional bus and crossbar interconnections. NOC improves the scalability of systems on a chip (SoC) and the power efficiency of complex SoCs compared to other designs. The wires and the links of the NOC are shared by many signals. A high level of parallelism is achieved because all links in the NOC can operate simultaneously on different data packets. Therefore, as the complexity of integrated subsystems keep growing, a NOC provides enhanced performance (such as throughput) and scalability in comparison with previous communication architectures (e.g., dedicated point-to-point signal wires, shared buses, or segmented buses with bridges). In other embodiments, NOC 154 can be replaced by a bus. Connected to and in communication with NOC 154 is processor 156, ECC engine 158, memory interface 160, and local memory controller 164. Local memory controller 164 is used to operate and communicate with local high speed memory 140 (e.g., DRAM, SRAM, MRAM).

ECC engine 158 performs error correction services. For example, ECC engine 158 performs data encoding and decoding. In one embodiment, ECC engine 158 is an electrical circuit programmed by software. For example, ECC engine 158 can be a processor that can be programmed. In other embodiments, ECC engine 158 is a custom and dedicated hardware circuit without any software. In another embodiment, the function of ECC engine 158 is implemented by processor 156.

Processor 156 performs the various controller memory operations, such as programming, erasing, reading, and memory management processes. In one embodiment, processor 156 is programmed by firmware. In other embodiments, processor 156 is a custom and dedicated hardware circuit without any software. Processor 156 also implements a translation module, as a software/firmware process or as a dedicated hardware circuit. In many systems, the non-volatile memory is addressed internally to the storage system using physical addresses associated with the one or more memory die. However, the host system will use logical addresses to address the various memory locations. This enables the host to assign data to consecutive logical addresses, while the storage system is free to store the data as it wishes among the locations of the one or more memory die. To implement this system, memory controller 120 (e.g., the translation module) performs address translation between the logical addresses used by the host and the physical addresses used by the memory die. One example implementation is to maintain tables (i.e. the L2P tables mentioned above) that identify the current translation between logical addresses and physical addresses. An entry in the L2P table may include an identification of a logical address and corresponding physical address. Although logical address to physical address tables (or L2P tables) include the word "tables" they need not literally be tables. Rather, the logical address to physical address tables (or L2P tables) can be any type of data structure. In some examples, the memory space of a storage system is so large that the local memory 140 cannot hold all of the L2P tables. In such a case, the entire set of L2P tables are stored in a storage 130 and a subset of the L2P tables are cached (L2P cache) in the local high speed memory 140.

Memory interface 160 communicates with non-volatile storage 130. In one embodiment, memory interface provides a Toggle Mode interface. Other interfaces can also be used. In some example implementations, memory interface 160 (or another portion of controller 120) implements a scheduler and buffer for transmitting data to and receiving data from one or more memory die.

In an embodiment, the non-volatile storage 130 has bitscan circuitry 131 that is configured to perform an optional second bitscan based on results of a first bitscan. The first bitscan is of a first strict subset of memory cells and the optional second bit scan is of a second strict subset of memory cells. Further details of embodiments of operation of the bitscan circuitry 131 are described below. The bitscan circuitry 131 may be used during process 1000 (see FIG. 10), process 1100 (see FIG. 11), and/or process 1200 (see FIG. 12), but is not limited to those processes.

Figure 2A:
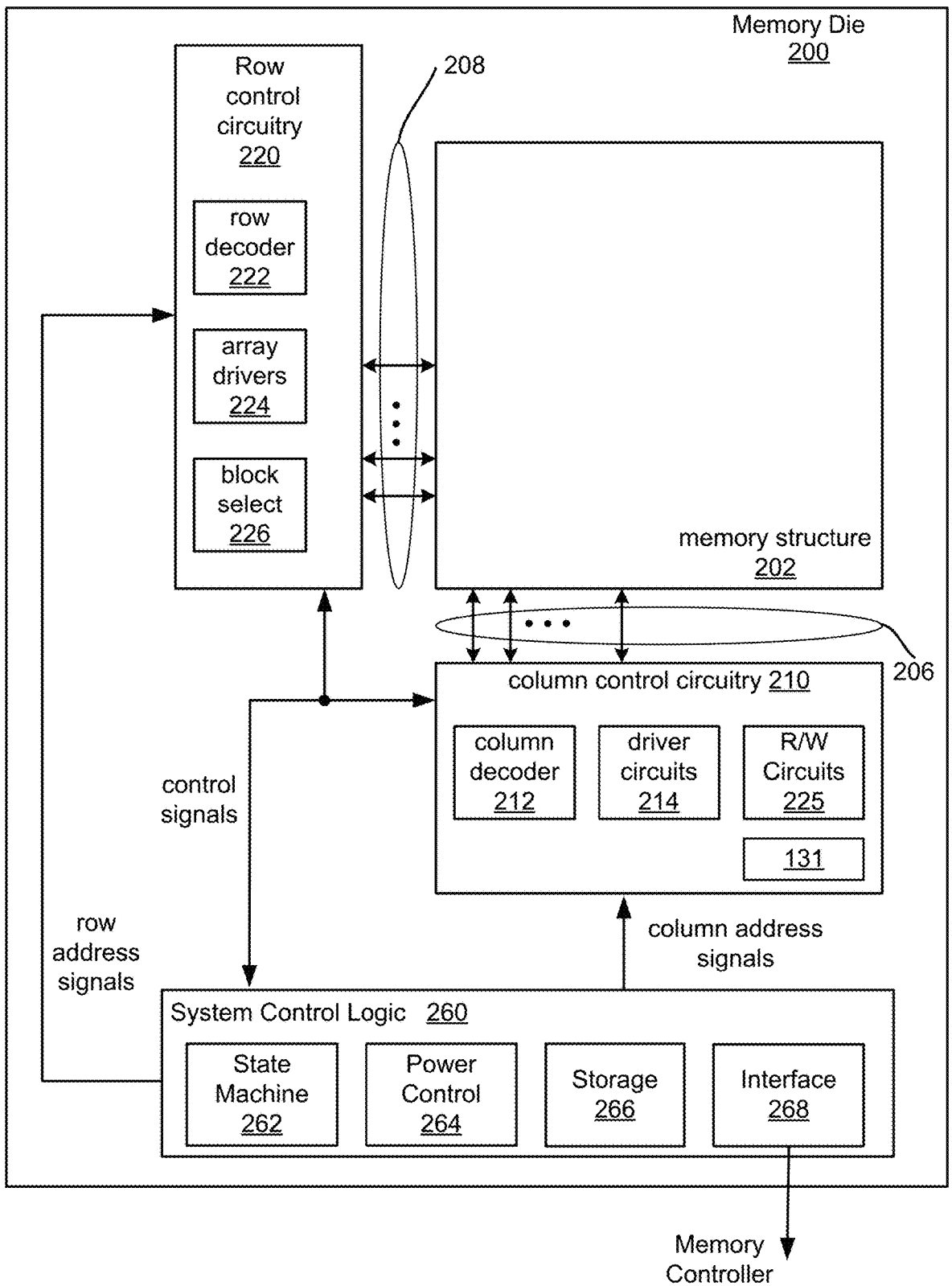
FIG. 2A is a block diagram of one embodiment of a memory die.

In one embodiment, non-volatile storage 130 comprises one or more memory dies. FIG. 2A is a functional block diagram of one embodiment of a memory die 200 that comprises non-volatile storage 130. Each of the one or more memory dies of non-volatile storage 130 can be implemented as memory die 200 of FIG. 2A. The components depicted in FIG. 2A are electrical circuits. Memory die 200 includes a memory structure 202 (e.g., memory array) that can comprise non-volatile memory cells (also referred to as non-volatile storage cells), as described in more detail below. The array terminal lines of memory structure 202 include the various layer(s) of word lines organized as rows, and the various layer(s) of bit lines organized as columns. However, other orientations can also be implemented. Memory die 200 includes row control circuitry 220, whose outputs are connected to respective word lines of the memory structure 202. Row control circuitry 220 receives a group of M row address signals and one or more various control signals from System Control Logic circuit 260, and typically may include such circuits as row decoders 222, array drivers 224, and block select circuitry 226 for both reading and writing (programming) operations. Row control circuitry 220 may also include read/write circuitry. Memory die 200 also includes column control circuitry 210 including read/write circuits 225. The read/write circuits 225 may contain sense amplifiers and data latches. The sense amplifier(s) input/outputs are connected to respective bit lines of the memory structure 202. Although only a single block is shown for structure 202, a memory die can include multiple arrays that can be individually accessed. Column control circuitry 210 receives a group of N column address signals and one or more various control signals from System Control Logic 260, and typically may include such circuits as column decoders 212, array terminal receivers or driver circuits 214, as well as read/write circuitry 225, and I/O multiplexers. In an embodiment, the column control circuitry 210 contains bitscan circuitry 131. However, the bitscan circuitry 131 could be located elsewhere on the memory die 200. In an embodiment, the bitscan circuitry 131 is in communication with the read/write circuits 225 such that the bitscan circuitry 131 is able to count how many memory cells have a Vt above/below a verify reference voltage applied to the cells.

System control logic 260 receives data and commands from memory controller 120 and provides output data and status to the host. In some embodiments, the system control logic 260 (which comprises one or more electrical circuits) includes state machine 262 that provides die-level control of memory operations. In one embodiment, the state machine 262 is programmable by software. In other embodiments, the state machine 262 does not use software and is completely implemented in hardware (e.g., electrical circuits). In another embodiment, the state machine 262 is replaced by a micro-controller or microprocessor, either on or off the memory chip. System control logic 260 can also include a power control module 264 that controls the power and voltages supplied to the rows and columns of the memory structure 202 during memory operations. System control logic 260 includes storage 266 (e.g., RAM, registers, latches, etc.), which may be used to store parameters for operating the memory structure 202.

Commands and data are transferred between memory controller 120 and memory die 200 via memory controller interface 268 (also referred to as a "communication interface"). Memory controller interface 268 is an electrical interface for communicating with memory controller 120. Examples of memory controller interface 268 include a Toggle Mode Interface and an Open NAND Flash Interface (ONFI). Other I/O interfaces can also be used. In one embodiment, the memory die 200 receives a command via memory controller interface 268 to perform a post-program erase.

In some embodiments, all the elements of memory die 200, including the system control logic 260, can be formed as part of a single die. In other embodiments, some or all of the system control logic 260 can be formed on a different die than the die that contains the memory structure 202.

In one embodiment, memory structure 202 comprises a three-dimensional memory array of non-volatile memory cells in which multiple memory levels are formed above a single substrate, such as a wafer. The memory structure may comprise any type of non-volatile memory that are monolithically formed in one or more physical levels of memory cells having an active area disposed above a silicon (or other type of) substrate. In one example, the non-volatile memory cells comprise vertical NAND strings with charge-trapping layers.

In another embodiment, memory structure 202 comprises a two-dimensional memory array of non-volatile memory cells. In one example, the non-volatile memory cells are NAND flash memory cells utilizing floating gates. Other types of memory cells (e.g., NOR-type flash memory) can also be used.

The exact type of memory array architecture or memory cell included in memory structure 202 is not limited to the examples above. Many different types of memory array architectures or memory technologies can be used to form memory structure 202. No particular non-volatile memory technology is required for purposes of the new claimed embodiments proposed herein. Other examples of suitable technologies for memory cells of the memory structure 202 include ReRAM memories (resistive random access memories), magnetoresistive memory (e.g., MRAM, Spin Transfer Torque MRAM, Spin Orbit Torque MRAM), FeRAM, phase change memory (e.g., PCM), and the like. Examples of suitable technologies for memory cell architectures of the memory structure 202 include two dimensional arrays, three dimensional arrays, cross-point arrays, stacked two dimensional arrays, vertical bit line arrays, and the like.

One example of a ReRAM cross-point memory includes reversible resistance-switching elements arranged in cross-point arrays accessed by X lines and Y lines (e.g., word lines and bit lines). In another embodiment, the memory cells may include conductive bridge memory elements. A conductive bridge memory element may also be referred to as a programmable metallization cell. A conductive bridge memory element may be used as a state change element based on the physical relocation of ions within a solid electrolyte. In some cases, a conductive bridge memory element may include two solid metal electrodes, one relatively inert (e.g., tungsten) and the other electrochemically active (e.g., silver or copper), with a thin film of the solid electrolyte between the two electrodes. As temperature increases, the mobility of the ions also increases causing the programming threshold for the conductive bridge memory cell to decrease. Thus, the conductive bridge memory element may have a wide range of programming thresholds over temperature.

Another example is magnetoresistive random access memory (MRAM) that stores data by magnetic storage elements. The elements are formed from two ferromagnetic layers, each of which can hold a magnetization, separated by a thin insulating layer. One of the two layers is a permanent magnet set to a particular polarity; the other layer's magnetization can be changed to match that of an external field to store memory. A memory device is built from a grid of such memory cells. In one embodiment for programming, each memory cell lies between a pair of write lines arranged at right angles to each other, parallel to the cell, one above and one below the cell. When current is passed through them, an induced magnetic field is created.

Phase change memory (PCM) exploits the unique behavior of chalcogenide glass. One embodiment uses a GeTe—Sb2Te3 super lattice to achieve non-thermal phase changes by simply changing the co-ordination state of the Germanium atoms with a laser pulse (or light pulse from another source). Therefore, the doses of programming are laser pulses. The memory cells can be inhibited by blocking the memory cells from receiving the light. In other PCM embodiments, the memory cells are programmed by current pulses. Note that the use of "pulse" in this document does not require a square pulse but includes a (continuous or non-continuous) vibration or burst of sound, current, voltage light, or other wave. These memory elements within the individual selectable memory cells, or bits, may include a further series element that is a selector, such as an ovonic threshold switch or metal insulator substrate.

A person of ordinary skill in the art will recognize that the technology described herein is not limited to a single specific memory structure, memory construction or material composition, but covers many relevant memory structures within the spirit and scope of the technology as described herein and as understood by one of ordinary skill in the art.

The elements of FIG. 2A can be grouped into two parts: (1) memory structure 202 and (2) peripheral circuitry, which includes all of the other components depicted in FIG. 2A. An important characteristic of a memory circuit is its capacity, which can be increased by increasing the area of the memory die of storage system 100 that is given over to the memory structure 202; however, this reduces the area of the memory die available for the peripheral circuitry. This can place quite severe restrictions on these elements of the peripheral circuitry. For example, the need to fit sense amplifier circuits within the available area can be a significant restriction on sense amplifier design architectures. With respect to the system control logic 260, reduced availability of area can limit the available functionalities that can be implemented on-chip. Consequently, a basic trade-off in the design of a memory die for the storage system 100 is the amount of area to devote to the memory structure 202 and the amount of area to devote to the peripheral circuitry.

Another area in which the memory structure 202 and the peripheral circuitry are often at odds is in the processing involved in forming these regions, since these regions often involve differing processing technologies and the trade-off in having differing technologies on a single die. For example, when the memory structure 202 is NAND flash, this is an NMOS structure, while the peripheral circuitry is often CMOS based. For example, elements such sense amplifier circuits, charge pumps, logic elements in a state machine, and other peripheral circuitry in system control logic 260 often employ PMOS devices. Processing operations for manufacturing a CMOS die will differ in many aspects from the processing operations optimized for an NMOS flash NAND memory or other memory cell technologies. Three-dimensional NAND structures (see, for example, FIG. 4) in particular may benefit from specialized processing operations.

To improve upon these limitations, embodiments described below can separate the elements of FIG. 2A onto separately formed dies that are then bonded together. More specifically, the memory structure 202 can be formed on one die (referred to as the memory die) and some or all of the peripheral circuitry elements, including one or more control circuits, can be formed on a separate die (referred to as the control die). For example, a memory die can be formed of just the memory elements, such as the array of memory cells of flash NAND memory, MRAM memory, PCM memory, ReRAM memory, or other memory type. Some or all of the peripheral circuitry, even including elements such as decoders and sense amplifiers, can then be moved on to a separate control die. This allows each of the memory die to be optimized individually according to its technology. For example, a NAND memory die can be optimized for an NMOS based memory array structure, without worrying about the CMOS elements that have now been moved onto a control die that can be optimized for CMOS processing. This allows more space for the peripheral elements, which can now incorporate additional capabilities that could not be readily incorporated were they restricted to the margins of the same die holding the memory cell array. The two die can then be bonded together in a bonded multi-die memory circuit, with the array on the one die connected to the periphery elements on the other die. Although the following will focus on a bonded memory circuit of one memory die and one control die, other embodiments can use more dies, such as two memory dies and one control die, for example.

FIG. 2B shows an alternative arrangement to that of FIG. 2A which may be implemented using wafer-to-wafer bonding to provide a bonded die pair. FIG. 2B depicts a functional block diagram of one embodiment of an integrated memory assembly 207. One or more integrated memory assemblies 207 may be used to implement the non-volatile storage 130 of storage system 100. The integrated memory assembly 207 includes two types of semiconductor dies (or more succinctly, "die"). Memory structure die 201 includes memory structure 202. Memory structure 202 includes non-volatile memory cells. Control die 211 includes control circuitry 260, 210, and 220 (as described above). In some embodiments, control die 211 is configured to connect to the memory structure 202 in the memory structure die 201. In some embodiments, the memory structure die 201 and the control die 211 are bonded together.

FIG. 2B shows an example of the peripheral circuitry, including control circuits, formed in a peripheral circuit or control die 211 coupled to memory structure 202 formed in memory structure die 201. Common components are labelled similarly to FIG. 2A. System control logic 260, row control circuitry 220, and column control circuitry 210 are located in control die 211. In some embodiments, all or a portion of the column control circuitry 210 and all or a portion of the row control circuitry 220 are located on the memory structure die 201. In some embodiments, some of the circuitry in the system control logic 260 is located on the on the memory structure die 201.

System control logic 260, row control circuitry 220, and column control circuitry 210 may be formed by a common process (e.g., CMOS process), so that adding elements and functionalities, such as ECC, more typically found on a memory controller 120 may require few or no additional process steps (i.e., the same process steps used to fabricate controller 120 may also be used to fabricate system control logic 260, row control circuitry 220, and column control circuitry 210). Thus, while moving such circuits from a die such as memory structure die 201 may reduce the number of steps needed to fabricate such a die, adding such circuits to a die such as control die 211 may not require many additional process steps. The control die 211 could also be referred to as a CMOS die, due to the use of CMOS technology to implement some or all of control circuitry 260, 210, 220.

FIG. 2B shows column control circuitry 210 including read/write circuits 225 on the control die 211 coupled to memory structure 202 on the memory structure die 201 through electrical paths 206. For example, electrical paths 206 may provide electrical connection between column decoder 212, driver circuitry 214, and R/W circuits 225 and bit lines of memory structure 202. Electrical paths may extend from column control circuitry 210 in control die 211 through pads on control die 211 that are bonded to corresponding pads of the memory structure die 201, which are connected to bit lines of memory structure 202. Each bit line of memory structure 202 may have a corresponding electrical path in electrical paths 206, including a pair of bond pads, which connects to column control circuitry 210. Similarly, row control circuitry 220, including row decoder 222, array drivers 224, and block select 226 are coupled to memory structure 202 through electrical paths 208. Each electrical path 208 may correspond to a word line, dummy word line, or select gate line. Additional electrical paths may also be provided between control die 211 and memory structure die 201.

For purposes of this document, the phrases "a control circuit" or "one or more control circuits" can include, but is not limited to, any one of or any combination of state machine 262, power control 264, all or a portion of system control logic 260, all or a portion of row control circuitry 220, all or a portion of column control circuitry 210, read/write circuits 225, sense amps, a microcontroller, a microprocessor, and/or other similar functioned circuits. A control circuit can include hardware only or a combination of hardware and software (including firmware). For example, a controller programmed by firmware to perform the functions described herein is one example of a control circuit. A control circuit can include a processor, FPGA, ASIC, integrated circuit, or other type of circuit.

For purposes of this document, the term "apparatus" can include, but is not limited to, one or more of, storage system 100, storage 130, memory die 200, integrated memory assembly 207, and/or control die 211.

Figure 3A:
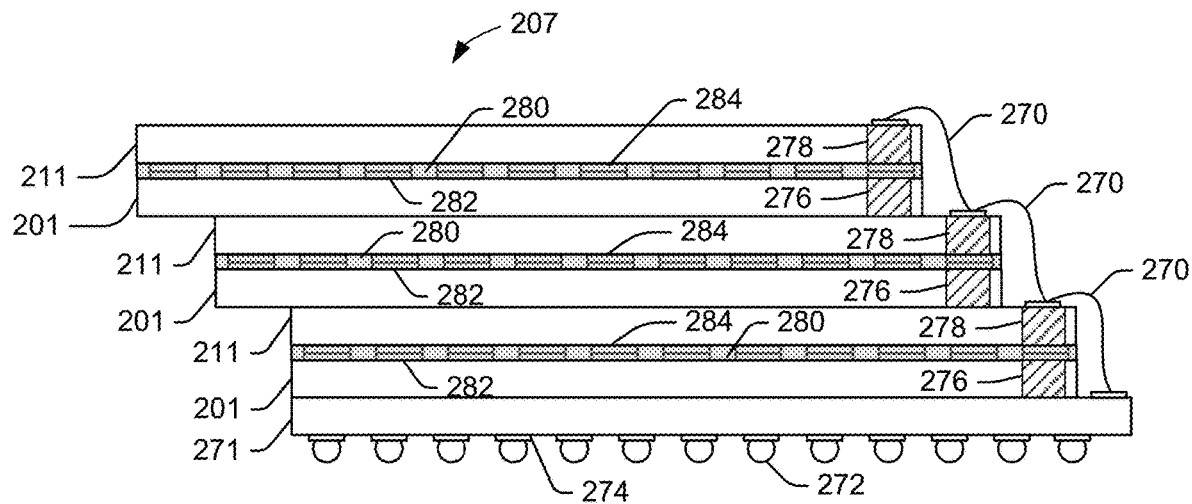
FIGS. 3A and 3B depict different embodiments of integrated memory assemblies.

In some embodiments, there is more than one control die 211 and more than one memory structure die 201 in an integrated memory assembly 207. In some embodiments, the integrated memory assembly 207 includes a stack of multiple control dies 211 and multiple memory structure dies 201. FIG. 3A depicts a side view of an embodiment of an integrated memory assembly 207 stacked on a substrate 271 (e.g., a stack comprising control die 211 and memory structure die). The integrated memory assembly 207 has three control dies 211 and three memory structure dies 201. In some embodiments, there are more than three memory structure dies 201 and more than three control dies 211. In FIG. 3A there are an equal number of memory structure dies 201 and control dies 211; however, in one embodiment, there are more memory structure dies 201 than control dies 211. For example, one control die 211 could control multiple memory structure dies 201.

Each control die 211 is affixed (e.g., bonded) to at least one of the memory structure die 201. Some of the bond pads 282/284 are depicted. There may be many more bond pads. A space between two die 201, 211 that are bonded together is filled with a solid layer 280, which may be formed from epoxy or other resin or polymer. This solid layer 280 protects the electrical connections between the die 201, 211, and further secures the die together. Various materials may be used as solid layer 280.

The integrated memory assembly 207 may for example be stacked with a stepped offset, leaving the bond pads at each level uncovered and accessible from above. Wire bonds 270 connected to the bond pads connect the control die 211 to the substrate 271. A number of such wire bonds may be formed across the width of each control die 211 (i.e., into the page of FIG. 3A).

A memory die through silicon via (TSV) 276 may be used to route signals through a memory structure die 201. A control die through silicon via (TSV) 278 may be used to route signals through a control die 211. The TSVs 276, 278 may be formed before, during or after formation of the integrated circuits in the semiconductor dies 201, 211. The TSVs may be formed by etching holes through the wafers. The holes may then be lined with a barrier against metal diffusion. The barrier layer may in turn be lined with a seed layer, and the seed layer may be plated with an electrical conductor such as copper, although other suitable materials such as aluminum, tin, nickel, gold, doped polysilicon, and alloys or combinations thereof may be used.

Solder balls 272 may optionally be affixed to contact pads 274 on a lower surface of substrate 271. The solder balls 272 may be used to couple the integrated memory assembly 207 electrically and mechanically to a host device such as a printed circuit board. Solder balls 272 may be omitted where the integrated memory assembly 207 is to be used as an LGA package. The solder balls 272 may form a part of the interface between integrated memory assembly 207 and memory controller 120.

Figure 3B:
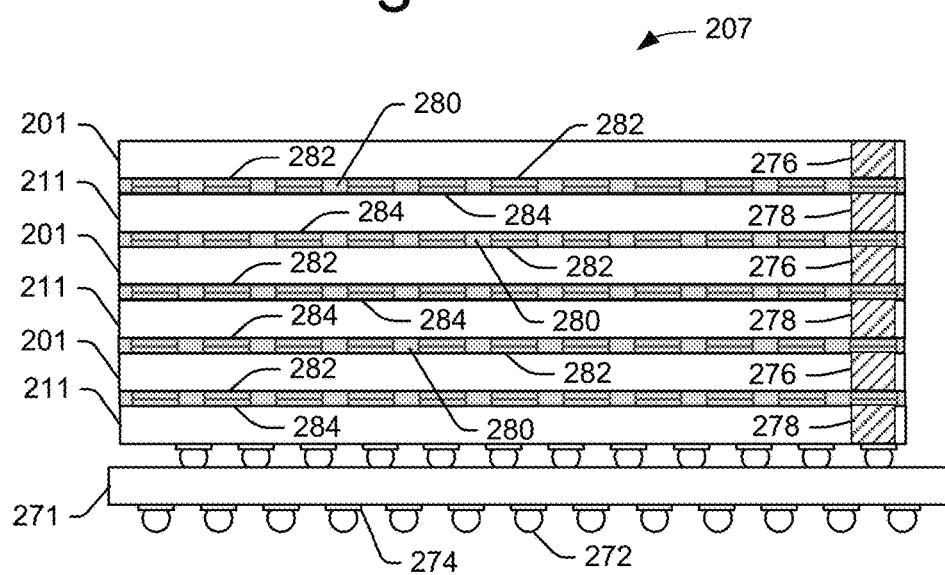

FIG. 3B depicts a side view of another embodiment of an integrated memory assembly 207 stacked on a substrate 271. The integrated memory assembly 207 of FIG. 3B has three control dies 211 and three memory structure dies 201. In some embodiments, there are many more than three memory structure dies 201 and many more than three control dies 211. In this example, each control die 211 is bonded to at least one memory structure die 201. Optionally, a control die 211 may be bonded to two or more memory structure dies 201.

Some of the bond pads 282, 284 are depicted. There may be many more bond pads. A space between two dies 201, 211 that are bonded together is filled with a solid layer 280, which may be formed from epoxy or other resin or polymer. In contrast to the example in FIG. 3A, the integrated memory assembly 207 in FIG. 3B does not have a stepped offset. A memory die through silicon via (TSV) 276 may be used to route signals through a memory structure die 201. A control die through silicon via (TSV) 278 may be used to route signals through a control die 211.

Solder balls 272 may optionally be affixed to contact pads 274 on a lower surface of substrate 271. The solder balls 272 may be used to couple the integrated memory assembly 207 electrically and mechanically to a host device such as a printed circuit board. Solder balls 272 may be omitted where the integrated memory assembly 207 is to be used as an LGA package.

As has been briefly discussed above, the control die 211 and the memory structure die 201 may be bonded together. Bond pads on each die 201, 211 may be used to bond the two die together. In some embodiments, the bond pads are bonded directly to each other, without solder or other added material, in a so-called Cu-to-Cu bonding process. In a Cu-to-Cu bonding process, the bond pads are controlled to be highly planar and formed in a highly controlled environment largely devoid of ambient particulates that might otherwise settle on a bond pad and prevent a close bond. Under such properly controlled conditions, the bond pads are aligned and pressed against each other to form a mutual bond based on surface tension. Such bonds may be formed at room temperature, though heat may also be applied. In embodiments using Cu-to-Cu bonding, the bond pads may be about 5 μm square and spaced from each other with a pitch of 5 μm to 5 μm. While this process is referred to herein as Cu-to-Cu bonding, this term may also apply even where the bond pads are formed of materials other than Cu.

When the area of bond pads is small, it may be difficult to bond the semiconductor die together. The size of, and pitch between, bond pads may be further reduced by providing a film layer on the surfaces of the semiconductor die including the bond pads. The film layer is provided around the bond pads. When the die are brought together, the bond pads may bond to each other, and the film layers on the respective die may bond to each other. Such a bonding technique may be referred to as hybrid bonding. In embodiments using hybrid bonding, the bond pads may be about 5 μm square and spaced from each other with a pitch of 1 μm to 5 μm. Bonding techniques may be used providing bond pads with even smaller sizes and pitches.

Some embodiments may include a film on surface of the dies 201, 211. Where no such film is initially provided, a space between the die may be under filled with an epoxy or other resin or polymer. The under-fill material may be applied as a liquid which then hardens into a solid layer. This under-fill step protects the electrical connections between the dies 201, 211, and further secures the die together. Various materials may be used as under-fill material.

FIG. 3C is a block diagram depicting one embodiment of a portion of column control circuitry 210 that contains a number of read/write circuits 225. Each read/write circuit 225 is partitioned into a sense amplifier 325 and data latches 340. A managing circuit 330 controls the read/write circuits 225. The managing circuit 330 may communicate with state machine 262. In one embodiment, each sense amplifier 325 is connected to a respective bit line. Each bit line may be connected, at one point in time, to one of a large number of different NAND strings. A select gate on the NAND string may be used to connect the NAND string channel to the bit line.

Each sense amplifier 325 operates to provide voltages to one of the bit lines (see BL0, BL1, BL2, BL3) during program, verify, erase, and read operations. Sense amplifiers are also used to sense the condition (e.g., data state) of a memory cell in a NAND string connected to the bit line that connects to the respective sense amplifier.

Each sense amplifier 325 may have a sense node. During sensing, a sense node is charged up to an initial voltage, Vsense_init, such as 3V. The sense node is then connected to the bit line for a sensing time, and an amount of decay of the sense node is used to determine whether a memory cell is in a conductive or non-conductive state. The amount of decay of the sense node also indicates whether a current Icell in the memory cell exceeds a reference current, Iref. A larger decay corresponds to a larger current. If Icell<=Iref, the memory cell is in a non-conductive state and if Icell>Iref, the memory cell is in a conductive state. In an embodiment, the sense node has a capacitor that is pre-charged and then discharged for the sensing time.

In particular, the comparison circuit 320 determines the amount of decay by comparing the sense node voltage to a trip voltage after the sensing time. If the sense node voltage decays below the trip voltage. Vtrip, the memory cell is in a conductive state and its Vth is at or below the verify voltage. If the sense node voltage does not decay below Vtrip, the memory cell is in a non-conductive state and its Vth is above the verify voltage. A sense node latch 322 is set to 0 or 1, for example, by the comparison circuit 320 based on whether the memory cell is in a conductive or non-conductive state, respectively. The bit in the sense node latch 322 can also be used in a lockout scan to decide whether to set a bit line voltage to an inhibit or a program enable level in a next program loop. The bit in the sense node latch 322 can also be used in a lockout mode to decide whether to set a bit line voltage to a sense voltage or a lockout voltage in a read operation. In an embodiment, the values in latches 322 in a set of sense amplifiers are transferred to the bitscan circuitry 131 to perform a bitscan.

The data latches 340 are coupled to the sense amplifier 325 by a local data bus 346. The data latches 340 include four latches (ADL, BDL, CDL, DDL) for each sense amplifier 325 in this example. More or fewer than four latches may be included in the data latches 340. In one embodiment, for programming each data latch 340 is used to store one bit to be stored into a memory cell and for reading each data latch 340 is used to store one bit read from a memory cell. In a four bit per memory cell embodiment, ADL stores a bit for a lower page of data, BDL stores a bit for a middle page of data, CDL stores a bit for an upper page of data, and DDL store a bit for a top page of data. Each read/write circuit 225 is connected to an XDL latch 348 by way of an XDL bus 352. In this example, transistor 336 connects local data bus 346 to XDL bus 352. An I/O interface 332 is connected to the XDL latches 348. The XDL latch 348 associated with a particular read/write circuit 225 serves as an interface latch for storing/latching data from the memory controller 120.

Managing circuit 330 performs computations, such as to determine the data stored in the sensed memory cell and store the determined data in the set of data latches. Each set of data latches 340 is used to store data bits determined by managing circuit 330 during a read operation, and to store data bits imported from the data bus 334 during a program operation which represent write data meant to be programmed into the memory. I/O interface 332 provides an interface between XDL latches 348 and the data bus 334.

During reading, the operation of the system is under the control of state machine 262 that controls the supply of different control gate voltages to the addressed memory cell. As it steps through the various predefined control gate voltages corresponding to the various memory states supported by the memory, the sense circuit may trip at one of these voltages and a corresponding output will be provided from the sense amplifier to managing circuit 330. At that point, managing circuit 330 determines the resultant memory state by consideration of the tripping event(s) of the sense circuit and the information about the applied control gate voltage from the state machine. It then computes a binary encoding for the memory state and stores the resultant data bits into data latches 340.

During program or verify operations for memory cells, the data to be programmed (write data) is stored in the set of data latches 340 from the data bus 334 by way of XDL latches 348. The program operation, under the control of the state machine 262, applies a series of programming voltage pulses to the control gates of the addressed memory cells. Each voltage pulse may be stepped up in magnitude from a previous program pulse by a step size in a process referred to as incremental step pulse programming. In one embodiment, each program voltage is followed by a verify operation to determine if the memory cells have been programmed to the desired memory state. In some cases, managing circuit 330 monitors the read back memory state relative to the desired memory state. When the two agree, managing circuit 330 sets the bit line in a program inhibit mode such as by updating its latches. This inhibits the memory cell coupled to the bit line from further programming even if additional program pulses are applied to its control gate.

Figure 4:
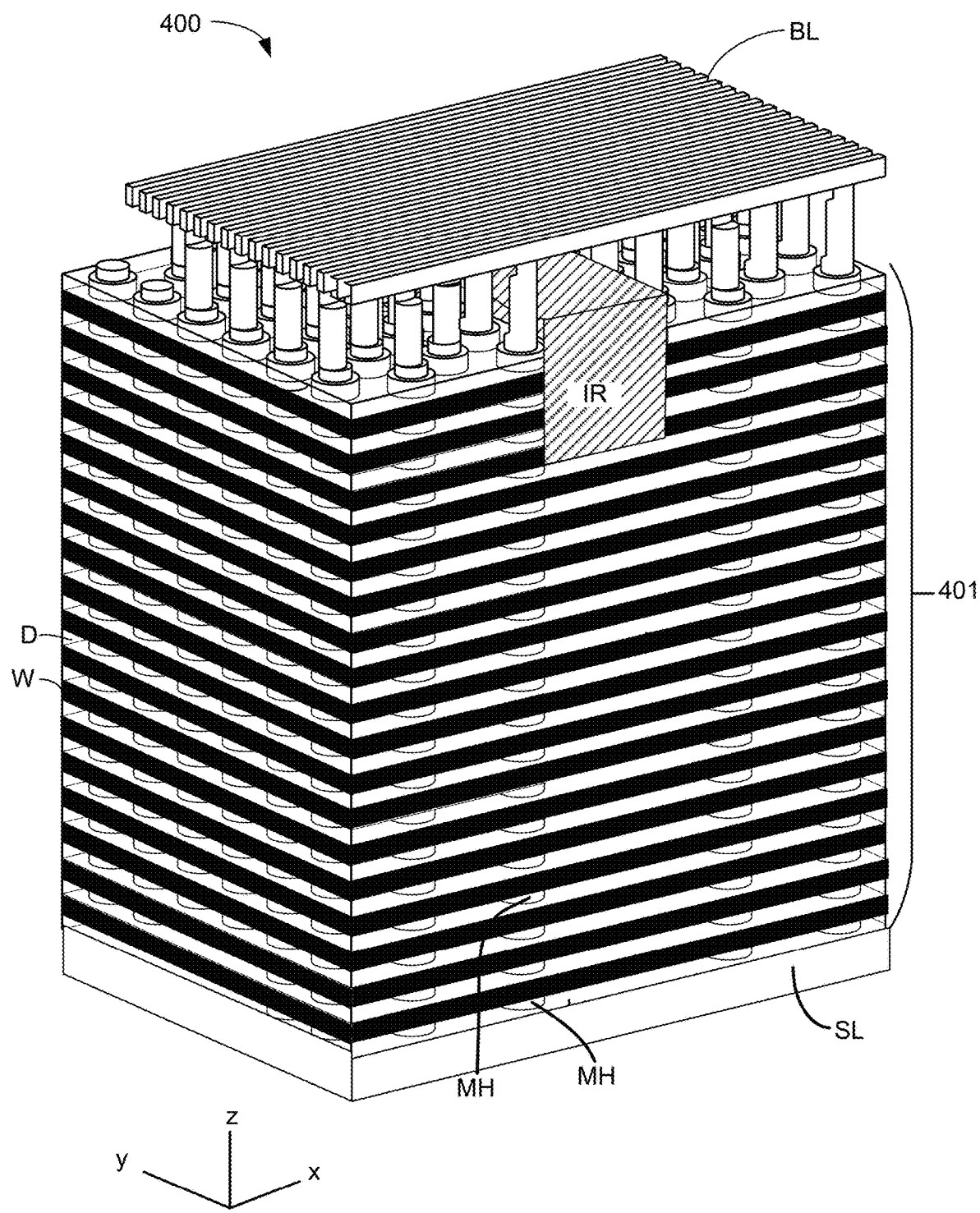
FIG. 4 is a perspective view of a portion of one example of a monolithic three dimensional memory structure.

FIG. 4 is a perspective view of a portion of one example of a monolithic three dimensional memory array/structure that can comprise memory structure 202, which includes a plurality non-volatile memory cells arranged as vertical NAND strings. For example, FIG. 4 shows a portion 400 of one block of memory. The structure depicted includes a set of bit lines BL positioned above a stack 401 of alternating dielectric layers and conductive layers. For example purposes, one of the dielectric layers is marked as D and one of the conductive layers (also called word line layers) is marked as W. The number of alternating dielectric layers and conductive layers can vary based on specific implementation requirements. In one embodiment the alternating dielectric layers and conductive layers are divided into four (or a different number of) regions (e.g., sub-blocks) by isolation regions IR. FIG. 4 shows one isolation region IR separating two sub-blocks. Below the alternating dielectric layers and word line layers is a source line layer SL. Memory holes are formed in the stack of alternating dielectric layers and conductive layers. For example, one of the memory holes is marked as MH. Note that in FIG. 4, the dielectric layers are depicted as see-through so that the reader can see the memory holes positioned in the stack of alternating dielectric layers and conductive layers. In one embodiment, NAND strings are formed by filling the memory hole with materials including a charge-trapping material to create a vertical column of memory cells. Each memory cell can store one or more bits of data. More details of the three dimensional monolithic memory array that comprises memory structure 202 is provided below.

Figure 4A:
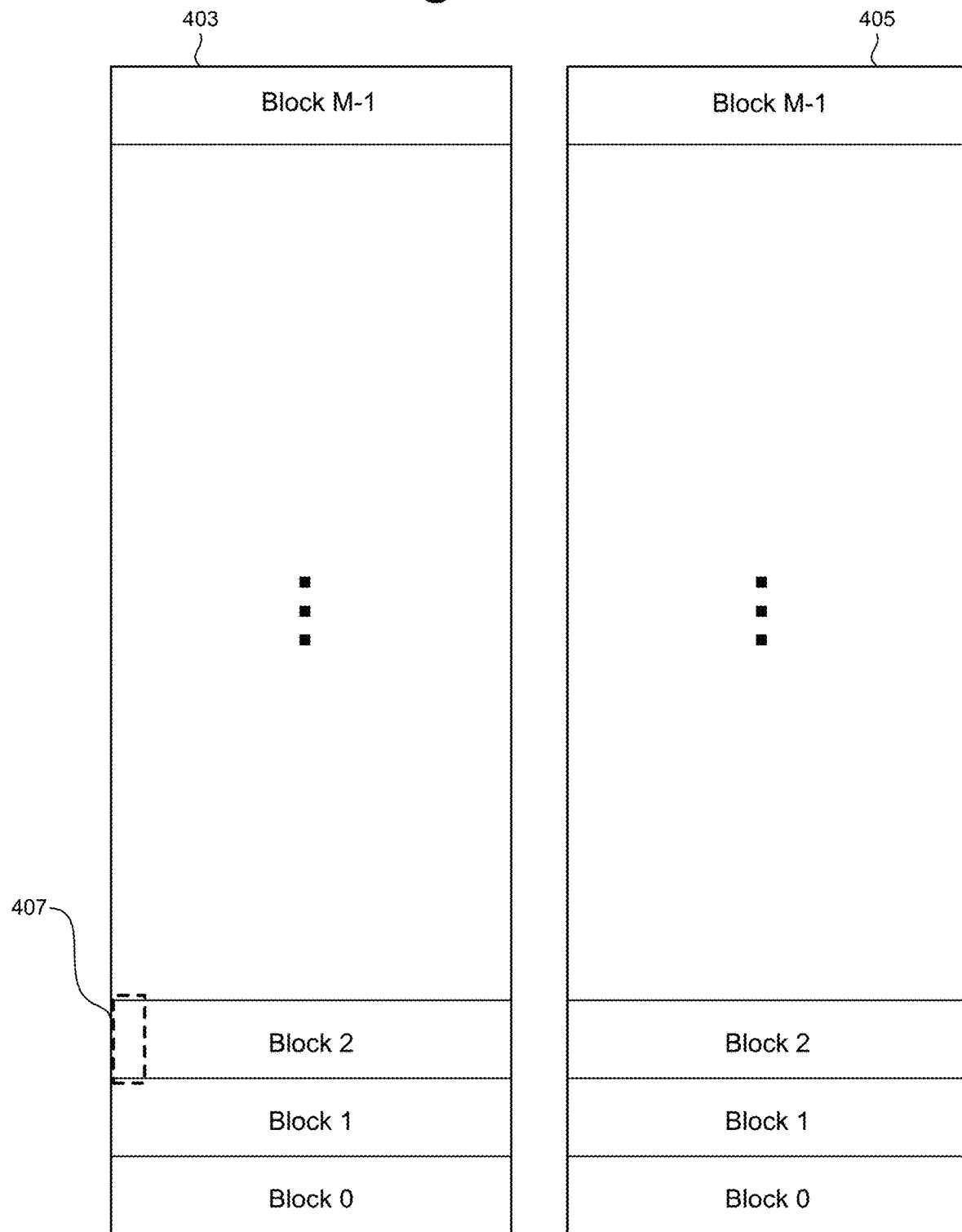
FIG. 4A is a block diagram of one example of a memory structure having two planes.

FIG. 4A is a block diagram explaining one example organization of memory structure 202, which is divided into two planes 403 and 405. Each plane is then divided into M blocks. In one example, each plane has about 2000 blocks. However, different numbers of blocks and planes can also be used. In one embodiment, a block of memory cells is a unit of erase. That is, all memory cells of a block are erased together. In other embodiments, blocks can be divided into sub-blocks and the sub-blocks can be the unit of erase. Memory cells can also be grouped into blocks for other reasons, such as to organize the memory structure to enable the signaling and selection circuits. In some embodiments, a block represents a group of connected memory cells as the memory cells of a block share a common set of word lines. For example, the word lines for a block are all connected to all of the vertical NAND strings for that physical block. Although FIG. 4A shows two planes 403/405, more or fewer than two planes can be implemented. In some embodiments, memory structure 202 includes four planes. In some embodiments, memory structure 202 includes eight planes. In some embodiments, programming can be performed in parallel in a first selected block in plane 403 and a second selected block in plane 405.

Figure 4B:
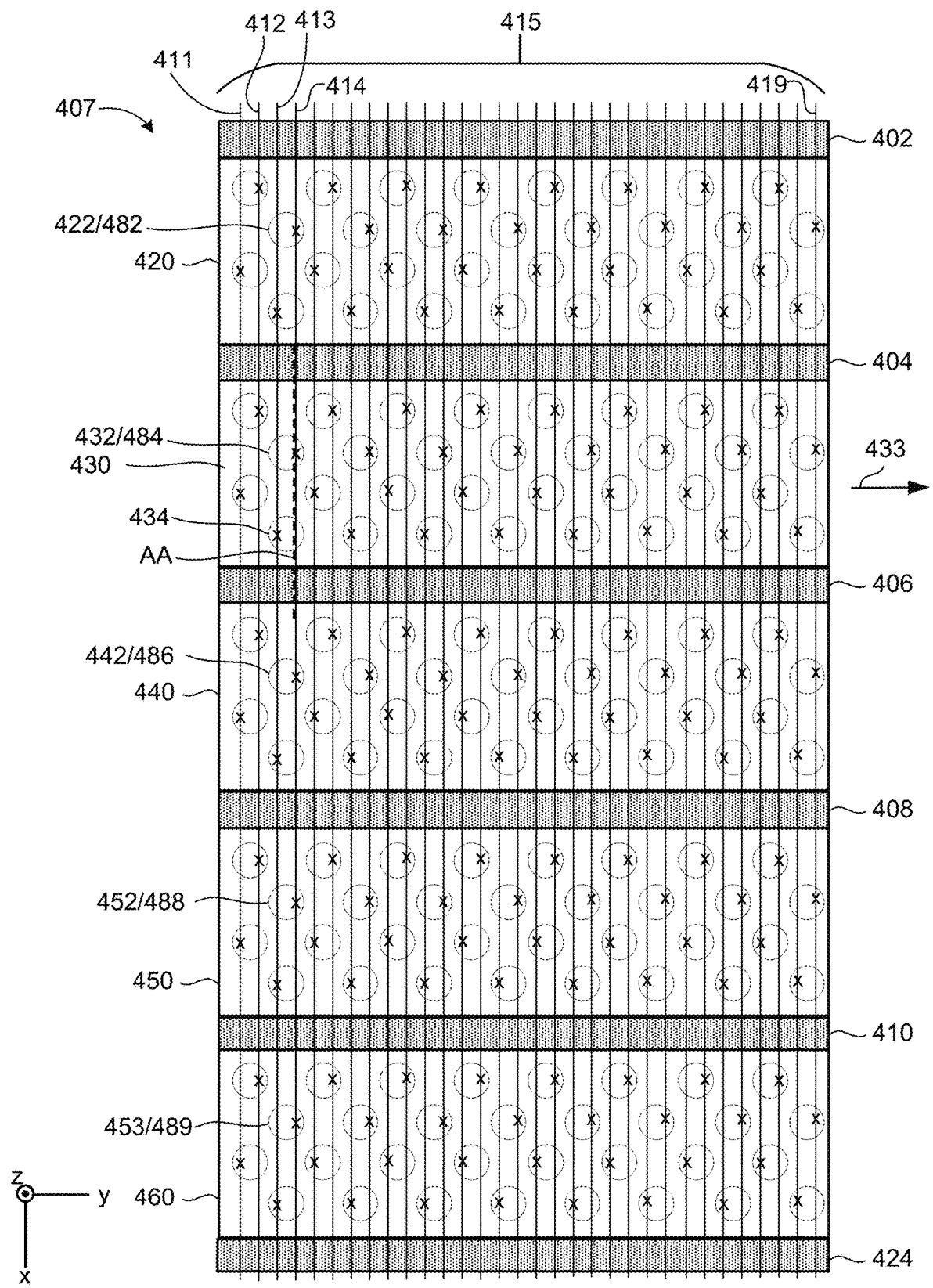
FIG. 4B is a block diagram depicting a top view of a portion of physical block of memory cells.

FIGS. 4B-4E depict an example three dimensional ("3D") NAND structure that corresponds to the structure of FIG. 4 and can be used to implement memory structure 202 of FIGS. 2A and 2B. FIG. 4B is a diagram depicting a top view of a portion 407 of Block 2. As can be seen from FIG. 4B, the block depicted in FIG. 4B extends in the direction of arrow 433. In one embodiment, the memory array has many layers; however, FIG. 4B only shows the top layer.

FIG. 4B depicts a plurality of circles that represent the vertical columns. Each of the vertical columns include multiple select transistors (also referred to as a select gate or selection gate) and multiple memory cells. In one embodiment, each vertical column implements a NAND string. For example, FIG. 4B depicts vertical columns 422, 432, 442, 452 and 453. Vertical column 422 implements NAND string 482. Vertical column 432 implements NAND string 484. Vertical column 442 implements NAND string 486. Vertical column 452 implements NAND string 488. Vertical column 453 implements NAND string 486. Vertical column 452 implements NAND string 489. More details of the vertical columns are provided below. Since the physical block depicted in FIG. 4B extends in the direction of arrow 433, the physical block includes more vertical columns than depicted in FIG. 4B.

FIG. 4B also depicts a set of bit lines 415, including bit lines 411, 412, 413, 414, . . . 419. FIG. 4B shows 32 bit lines because only a portion of the block is depicted. It is contemplated that more than 32 bit lines connected to vertical columns of the block. Each of the circles representing vertical columns has an "x" to indicate its connection to one bit line. For example, bit line 414 is connected to vertical columns 422, 432, 442 and 452.

The block depicted in FIG. 4B includes a set of isolation regions 402, 404, 406, 408, 410, and 424, which may be formed of SiO$_2$; however, other dielectric materials can also be used. Isolation regions 402, 404, 406, 408, 410, and 424 serve to divide the top layers of the physical block into five regions; for example, the top layer depicted in FIG. 4B is divided into regions 420, 430, 440, 450, and 460 of which are referred to as sub-blocks. In one embodiment, isolation regions 402 and 424 separate the block from adjacent blocks. Thus, isolation regions 402 and 424 may extend down to the substrate. In one embodiment, the isolation regions 404, 406, 408, and 410 only divide the layers used to implement select gates so that NAND strings in different sub-blocks can be independently selected. Referring back to FIG. 4, the IR region may correspond to any of isolation regions 404, 406, 408, or 410.

In one example implementation, a bit line only connects to one vertical column/NAND string in each of regions (sub-blocks) 420, 430, 440, 450, and 460. In that implementation, each block has twenty rows of active columns and each bit line connects to five rows in each block. In one embodiment, all of the five vertical columns/NAND strings connected to a common bit line are connected to the same word line (or set of word lines); therefore, the system uses the drain side selection lines to choose one (or another subset) of the five to be subjected to a memory operation (program, verify, read, and/or erase).

Although FIG. 4B shows each region (420, 430, 440, 450, 460) having four rows of vertical columns, five regions (420, 430, 440, 450, 460) and twenty rows of vertical columns in a block, those exact numbers are an example implementation. Other embodiments may include more or fewer regions (420, 430, 440, 450, 460) per block, more or fewer rows of vertical columns per region and more or fewer rows of vertical columns per block. FIG. 4B also shows the vertical columns being staggered. In other embodiments, different patterns of staggering can be used. In some embodiments, the vertical columns are not staggered.

Figure 4C:
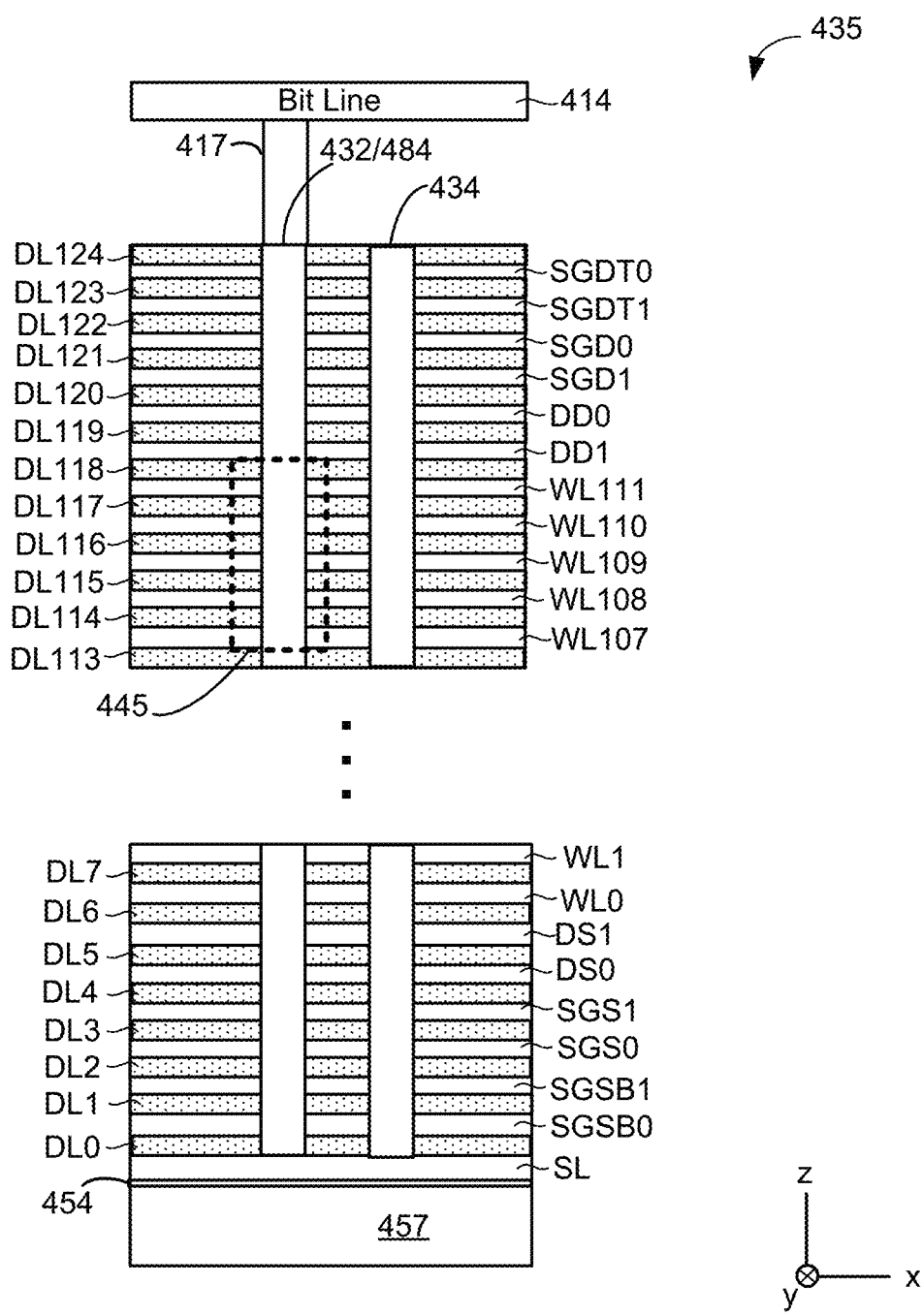
FIG. 4C depicts an example of a stack showing a cross-sectional view along line AA of FIG. 4B.

FIG. 4C depicts an example of a stack 435 showing a cross-sectional view along line AA of FIG. 4B. The SGD layers include SGDT0, SGDT1, SGD0, and SGD1. The SGD layers may have more or fewer than four layers. The SGS layers includes SGSB0, SGSB1, SGS0, and SGS1. The SGS layers may have more or fewer than four layers. Four dummy word line layers DD0, DD1, DS1, and DS0 are provided, in addition to the data word line layers WL0-WL111. There may be more or fewer than 112 data word line layers and more or fewer than four dummy word line layers. Each NAND string has a drain side select gate at the SGD layers. Each NAND string has a source side select gate at the SGS layers. Also depicted are dielectric layers DL0-DL124.

Columns 432, 434 of memory cells are depicted in the multi-layer stack. The stack includes a substrate 457, an insulating film 454 on the substrate, and a portion of a source line SL. A portion of the bit line 414 is also depicted. Note that NAND string 484 is connected to the bit line 414. NAND string 484 has a source-end at a bottom of the stack and a drain-end at a top of the stack. The source-end is connected to the source line SL. A conductive via 417 connects the drain-end of NAND string 484 to the bit line 414.

In one embodiment, the memory cells are arranged in NAND strings. The word line layers WL0-WL111 connect to memory cells (also called data memory cells). Dummy word line layers DD0, DD1, DS0 and DS1 connect to dummy memory cells. A dummy memory cell does not store and is not eligible to store host data (data provided from the host, such as data from a user of the host), while a data memory cell is eligible to store host data. In some embodiments, data memory cells and dummy memory cells may have a same structure. Drain side select layers SGD are used to electrically connect and disconnect (or cut off) the channels of respective NAND strings from bit lines. Source side select layers SGS are used to electrically connect and disconnect (or cut off) the channels of respective NAND strings from the source line SL.

Figure 4D:
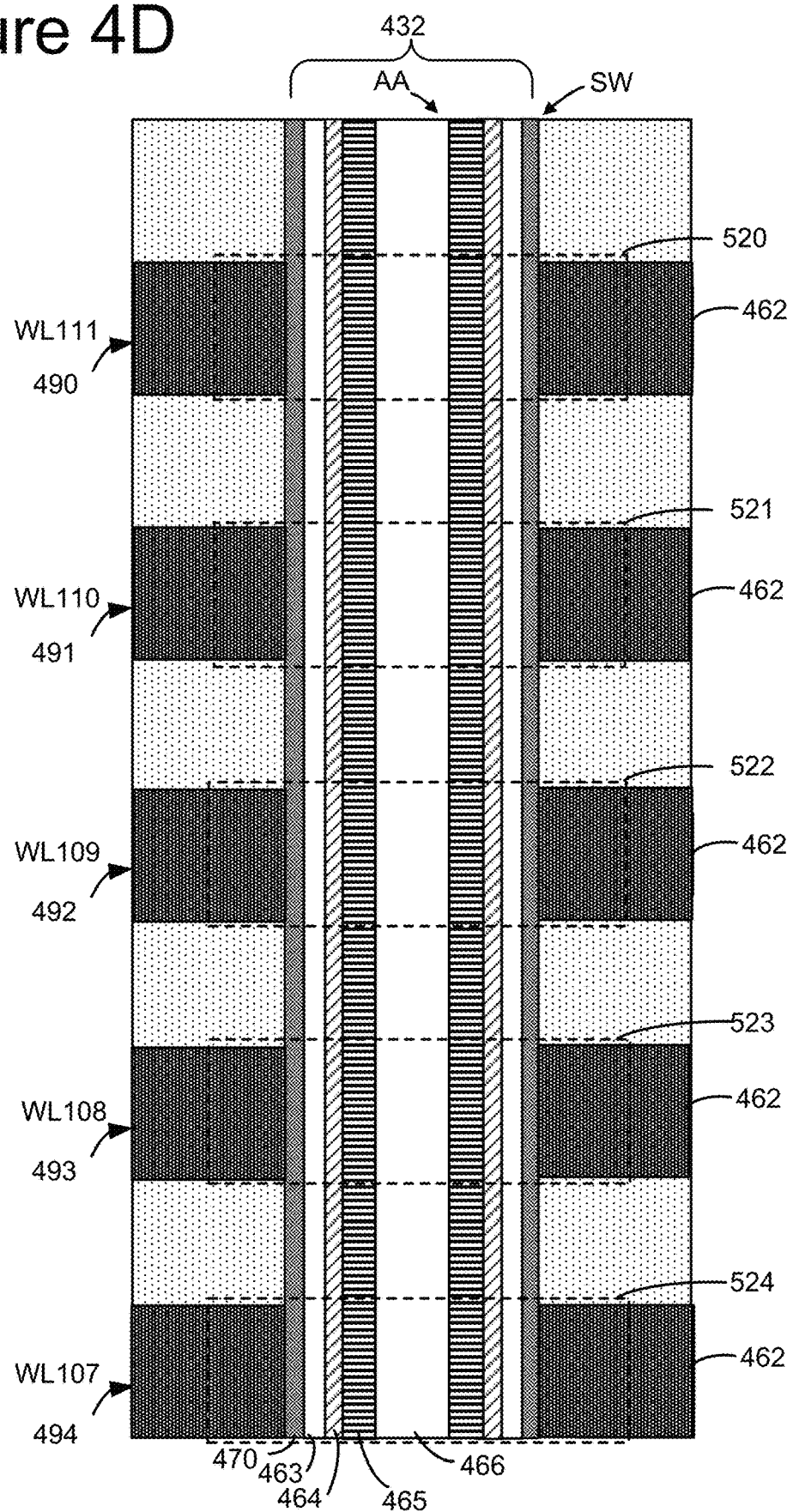
FIG. 4D depicts a view of the region 445 of FIG. 4C.

FIG. 4D depicts a view of the region 445 of FIG. 4C. Data memory cell transistors 520, 521, 522, 523, and 524 are indicated by the dashed lines. A number of layers can be deposited along the sidewall (SW) of the memory hole 432 and/or within each word line layer, e.g., using atomic layer deposition. For example, each column (e.g., the pillar which is formed by the materials within a memory hole) can include a blocking oxide/block high-k material 470, charge-trapping layer or film 463 such as SiN or other nitride, a tunneling layer 464, a polysilicon body or channel 465, and a dielectric core 466. A word line layer can include a conductive metal 462 such as Tungsten as a control gate. For example, control gates 490, 491, 492, 493 and 494 are provided. In this example, all of the layers except the metal are provided in the memory hole. In other approaches, some of the layers can be in the control gate layer. Additional pillars are similarly formed in the different memory holes. A pillar can form a columnar active area (AA) of a NAND string.

When a data memory cell transistor is programmed, electrons are stored in a portion of the charge-trapping layer which is associated with the data memory cell transistor. These electrons are drawn into the charge-trapping layer from the channel, and through the tunneling layer. The Vth of a data memory cell transistor is increased in proportion to the amount of stored charge. During an erase operation, the electrons return to the channel.

Each of the memory holes can be filled with a plurality of annular layers (also referred to as memory film layers) comprising a blocking oxide layer, a charge trapping layer, a tunneling layer and a channel layer. A core region of each of the memory holes is filled with a body material, and the plurality of annular layers are between the core region and the WLLs in each of the memory holes. In some cases, the tunneling layer 464 can comprise multiple layers such as in an oxide-nitride-oxide configuration.

Figure 4E:
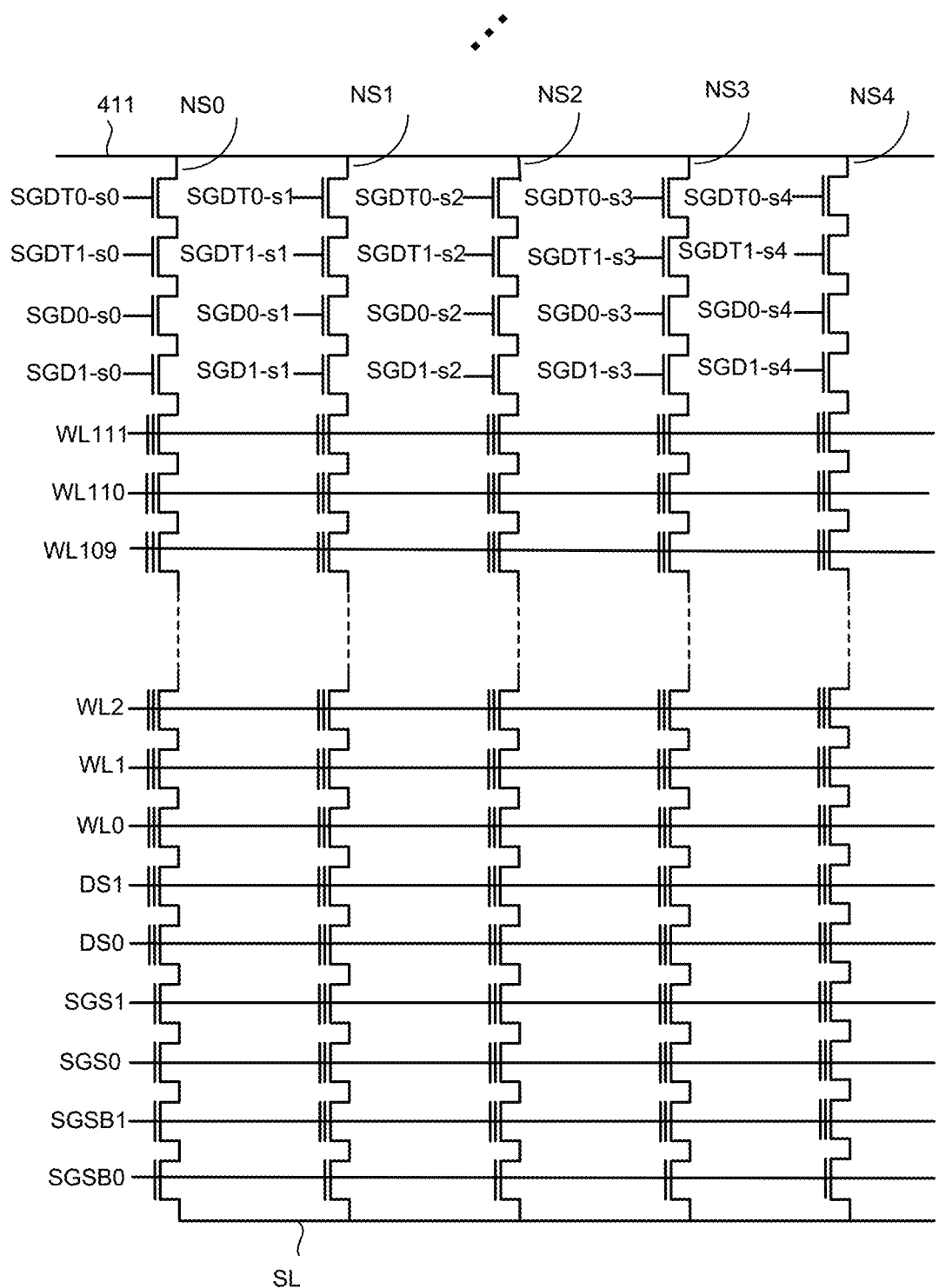
FIG. 4E is a schematic diagram of a portion of one example of a physical block, depicting several NAND strings.

FIG. 4E is a schematic diagram of a portion of the memory array 202. FIG. 4E shows physical data word lines WL0-WL111 running across the entire block. The structure of FIG. 4E corresponds to a portion 407 in Block 2 of FIG. 4A, including bit line 411. Within the physical block, in one embodiment, each bit line is connected to five NAND strings. Thus, FIG. 4E shows bit line 411 connected to NAND string NS0, NAND string NS1, NAND string NS2, NAND string NS3, and NAND string NS4.

In one embodiment, there are five sets of drain side select lines in the block. For example, the set of drain side select lines connected to NS0 include SGDT0-s0, SGDT1-s0, SGD0-s0, and SGD1-s0. The set of drain side select lines connected to NS1 include SGDT0-s1. SGDT1-s1, SGD0-s1, and SGD1-s1. The set of drain side select lines connected to NS2 include SGDT0-s2, SGDT1-s2, SGD0-s2, and SGD1-s2. The set of drain side select lines connected to NS3 include SGDT0-s3, SGDT1-s3, SGD0-s3, and SGD1-s3. The set of drain side select lines connected to NS4 include SGDT0-s4, SGDT1-s4, SGD0-s4, and SGD1-s4. Herein the term "SGD" may be used as a general term to refer to any one or more of the lines in a set of drain side select lines. In an embodiment, each line in a given set may be operated independent from the other lines in that set to allow for different voltages to the gates of the four drain side select transistors on the NAND string. Moreover, each set of drain side select lines can be selected independent of the other sets. Each set drain side select lines connects to a group of NAND strings in the block. Only one NAND string of each group is depicted in FIG. 4E. These five sets of drain side select lines correspond to five sub-blocks. A first sub-block corresponds to those vertical NAND strings controlled by SGDT0-s0, SGDT1-s0, SGD0-s0, and SGD1-s0. A second sub-block corresponds to those vertical NAND strings controlled by SGDT0-s1, SGDT1-s1, SGD0-s1, and SGD1-s1. A third sub-block corresponds to those vertical NAND strings controlled by SGDT0-s2, SGDT1-s2, SGD0-s2, and SGD1-s2. A fourth sub-block corresponds to those vertical NAND strings controlled by SGDT0-s3, SGDT1-s3, SGD0-s3, and SGD1-s3. A fifth sub-block corresponds to those vertical NAND strings controlled by SGDT0-s4, SGDT1-s4, SGD0-s4, and SGD1-s4. As noted, FIG. 4E only shows the NAND strings connected to bit line 411. However, a full schematic of the block would show every bit line and five vertical NAND strings connected to each bit line.

In one embodiment, all of the memory cells on the NAND strings in a physical block are erased as a unit. However in some embodiments, a block is operated as an upper tier and a lower tier, wherein the upper tier and the lower tier each form an erase unit. For example, memory cells connected to WL0-WL61 may be in the lower tier and memory cells connected to WL62-WL111 may be in the upper tier. Hence, memory cells connected to WL0-WL61 may be in one erase unit and memory cells connected to WL62-WL111 may be in another erase unit. A block could be operated in more than two tiers. Erase units can be formed based on other divisions of blocks.

Although the example memories of FIGS. 4-4E are three dimensional memory structure that includes vertical NAND strings with charge-trapping material, other 3D memory structures can also be used with the technology described herein.

The storage systems discussed above can be erased, programmed and read. At the end of a successful programming process, the threshold voltages of the memory cells should be within one or more distributions of threshold voltages for programmed memory cells or within a distribution of threshold voltages for erased memory cells, as appropriate. Memory cells that store one bit of data per memory cell data are referred to as single level cells ("SLC"). The data stored in SLC memory cells is referred to as SLC data; therefore, SLC data comprises one bit per memory cell. Memory cells that store multiple bit per memory cell data are referred to as multi-level cells ("MLC"). The data stored in MLC memory cells is referred to as MLC data; therefore, MLC data comprises multiple bits per memory cell. Data stored as multiple bits of data per memory cell is MLC data. In the example embodiment of FIG. 5A, each memory cell stores three bits of data. Other embodiments may use other data capacities per memory cell (e.g., such as two, four, or five bits of data per memory cell).

FIG. 5A shows eight threshold voltage distributions, corresponding to eight data states. The first threshold voltage distribution (data state) Er represents memory cells that are erased. The other seven threshold voltage distributions (data states) A-G represent memory cells that are programmed and, therefore, are also called programmed states. Each threshold voltage distribution (data state) corresponds to predetermined values for the set of data bits. The specific relationship between the data programmed into the memory cell and the threshold voltage levels of the cell depends upon the data encoding scheme adopted for the cells. In one embodiment, data values are assigned to the threshold voltage ranges using a Gray code assignment so that if the threshold voltage of a memory erroneously shifts to its neighboring physical state, only one bit will be affected. In an embodiment, the number of memory cells in each state is about the same.

FIG. 5A shows seven read reference voltages, VrA, VrB, VrC, VrD, VrE, VrF, and VrG for reading data from memory cells. By testing (e.g., performing sense operations) whether the threshold voltage of a given memory cell is above or below the seven read reference voltages, the system can determine what data state (i.e., A, B, C, D, . . . ) a memory cell is in. FIG. 5A also shows a number of verify reference voltages. The verify reference voltages are VvA, VvB, VvC, VvD, VVE, VvF, and VvG. In some embodiments, when programming memory cells to data state A, the system will test whether those memory cells have a threshold voltage greater than or equal to VvA. If the memory cell has a threshold voltage greater than or equal to VvA, then the memory cell is locked out from further programming. Similar reasoning applies to the other data states. In embodiments, the bitscan circuitry 131 may be used to count how many cells have passed program verify.

FIG. 5B depicts a threshold voltage (Vt) distributions when each memory cells stores four bits. There are sixteen data states (S0-S15). Memory cells are programmed from an erased state to one of 15 programmed states (S1-S15). There are 15 program verify voltages (Vv1-Vv15), with each program verify voltage used to verify one of the programmed states. For example, memory cells to be programmed to S1 have their Vt compared to Vv1, memory cells to be programmed to S2 have their Vt compared to Vv2, etc.

Figure 6:
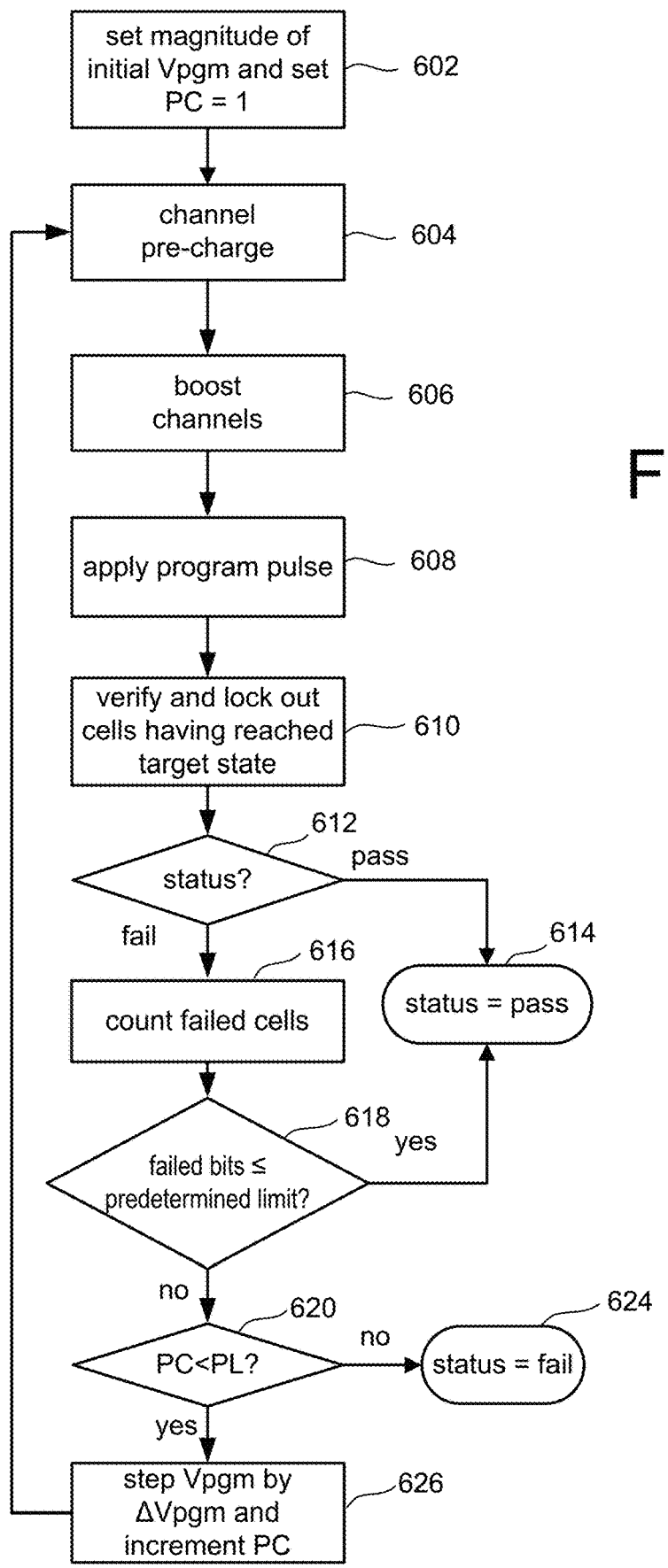
FIG. 6 is a flowchart describing one embodiment of a process for programming memory cells.

FIG. 6 is a flowchart describing one embodiment of a process for programming memory cells. For purposes of this document, the term program and programming are synonymous with write and writing. In one example embodiment, the process of FIG. 6 is performed for memory structure 202 using the one or more control circuits (e.g., system control logic 260, column control circuitry 210, row control circuitry 220) discussed above. In one example embodiment, the process of FIG. 6 is performed by integrated memory assembly 207 using the one or more control circuits (e.g., system control logic 260, column control circuitry 210, row control circuitry 220) of control die 211 to program memory cells on memory structure die 201. The process includes multiple loops, each of which includes a program phase and a verify phase.

Typically, the program voltage applied to the control gates (via a selected data word line) during a program operation is applied as a series of program pulses (e.g., voltage pulses). Between programming pulses are a set of verify pulses (e.g., voltage pulses) to perform verification. In many implementations, the magnitude of the program pulses is increased with each successive pulse by a predetermined step size. In step 602 of FIG. 6, the programming voltage signal (Vpgm) is initialized to the starting magnitude (e.g., ~12-16V or another suitable level) and a program counter PC maintained by state machine 262 is initialized at 1. In one embodiment, the group of memory cells selected to be programmed (referred to herein as the selected memory cells) are programmed concurrently and are all connected to the same word line (the selected word line). There will likely be other memory cells that are not selected for programming (unselected memory cells) that are also connected to the selected word line. That is, the selected word line will also be connected to memory cells that are supposed to be inhibited from programming. Additionally, as memory cells reach their intended target data state, they will be inhibited from further programming. Those NAND strings (e.g., unselected NAND strings) that include memory cells connected to the selected word line that are to be inhibited from programming have their channels boosted to inhibit programming. When a channel has a boosted voltage, the voltage differential between the channel and the word line is not large enough to cause programming. To assist in the boosting, in step 604 the system will pre-charge channels of NAND strings that include memory cells connected to the selected word line that are to be inhibited from programming. In step 606, NAND strings that include memory cells connected to the selected word line that are to be inhibited from programming have their channels boosted to inhibit programming. Such NAND strings are referred to herein as "unselected NAND strings." In one embodiment, the unselected word lines receive one or more boosting voltages (e.g., ~7-11 volts) to perform boosting schemes. A program inhibit voltage is applied to the bit lines coupled the unselected NAND string.

In step 608, a program voltage pulse of the programming voltage Vpgm is applied to the selected word line (the word line selected for programming). If a memory cell on a NAND string should be programmed, then the corresponding bit line is biased at a program enable voltage. In step 608, the program pulse is concurrently applied to all memory cells connected to the selected word line so that all of the memory cells connected to the selected word line are programmed concurrently (unless they are inhibited from programming). That is, they are programmed at the same time or during overlapping times (both of which are considered concurrent). In this manner all of the memory cells connected to the selected word line will concurrently have their threshold voltage change, unless they are inhibited from programming.

In step 610, program verify is performed and memory cells that have reached their target states are locked out from further programming. Step 610 includes performing verification of programming by sensing at one or more verify reference levels. In one embodiment, the verification process is performed by testing whether the threshold voltages of the memory cells selected for programming have reached the appropriate verify reference voltage. In step 610, a memory cell may be locked out after the memory cell has been verified (by a test of the Vt) that the memory cell has reached its target state. For example, a memory cell may be locked out if it reaches a verify reference voltage. In one embodiment, one or more data latches in the managing circuit 330 or R/W circuits 225 are used to indicate whether a memory cell is locked out or is to receive full programming. One or more bitscans may be performed based on the sensing results of step 610. In one embodiment, a bitscan of a first strict subset of cells is performed. In one embodiment, based on results of the first bitscan, a determination of whether to perform a second bitscan of a second strict subset of cells may be made.

If, in step 612, it is determined that all of the memory cells have reached their target threshold voltages (pass), the programming process is complete and successful because all selected memory cells were programmed and verified to their target states. A status of "PASS" is reported in step 614. Otherwise if, in step 612, it is determined that not all of the memory cells have reached their target threshold voltages (fail), then the programming process continues to step 616.

In step 616, the number of memory cells that have not yet reached their respective target threshold voltage distribution are counted. That is, the number of memory cells that have, so far, failed to reach their target state are counted. In an embodiment, this counting is done by bitscan circuitry 131. In an embodiment, the bitscan circuitry 131 will sample one or more strict subsets of the memory cells to count the failed bits. Thus, the fail bit count may be based on a sample of memory cells. In an embodiment, a separate fail bit count may be kept for each data state. Note that, in some embodiments, program verify of the higher Vt data states does not begin until later program loops, in which case step 618 could be skipped until verify of all data states has been initiated. In one embodiment, the test in step 618 is for a total fail bit count for all data states. In one embodiment, the test in step 618 is for each data state to pass based on a fail bit count for that data state.

In step 618, it is determined whether the count from step 616 is less than or equal to a predetermined limit. In one embodiment, the predetermined limit is based on the number of bits that can be corrected by error correction codes (ECC) during a read process for the page of memory cells. This count may be based on one or more bitscans. In one embodiment, rather than performing a bitscan of all memory cells being programmed, certain strict subsets of memory cells are selected for the bitscan(s). Thus, the allowed number of failed bits may be a pro rata portion of the number of bits that can be corrected by error correction codes (ECC) during a read process for the page of memory cells. If the number of failed cells is less than or equal to the predetermined limit, than the programming process can stop and a status of "PASS" is reported in step 614. In this situation, enough memory cells programmed correctly such that the few remaining memory cells that have not been completely programmed can be corrected using ECC during the read process. In some embodiments, the predetermined limit used in step 618 is below the number of bits that can be corrected by error correction codes (ECC) during a read process to allow for future/additional errors. When programming fewer than all of the memory cells for a page, comparing a count for only one data state (or less than all states), or sampling only some of the memory cells, then the predetermined limit can be a portion (pro-rata or not pro-rata) of the number of bits that can be corrected by ECC during a read process for the page of memory cells. In some embodiments, the limit is not predetermined. Instead, it changes based on the number of errors already counted for the page, the number of program-erase cycles performed or other criteria.

If the number of failed memory cells is not less than the predetermined limit, then the programming process continues at step 620 and the program counter PC is checked against the program limit value (PL). Examples of program limit values include 6, 12, 16, 19, 20 and 30; however, other values can be used. If the program counter PC is not less than the program limit value PL, then the program process is considered to have failed and a status of FAIL is reported in step 624. If the program counter PC is less than the program limit value PL, then the process continues at step 626 during which time the Program Counter PC is incremented by 1 and the programming voltage signal Vpgm is stepped up to the next magnitude. For example, the next pulse will have a magnitude greater than the previous pulse by a step size ΔVpgm (e.g., a step size of 0.1-1.0 volts). After step 626, the process loops back to step 604 and another program pulse is applied to the selected word line so that another iteration (steps 604-626) of the programming process of FIG. 6 is performed.

Figure 7A:
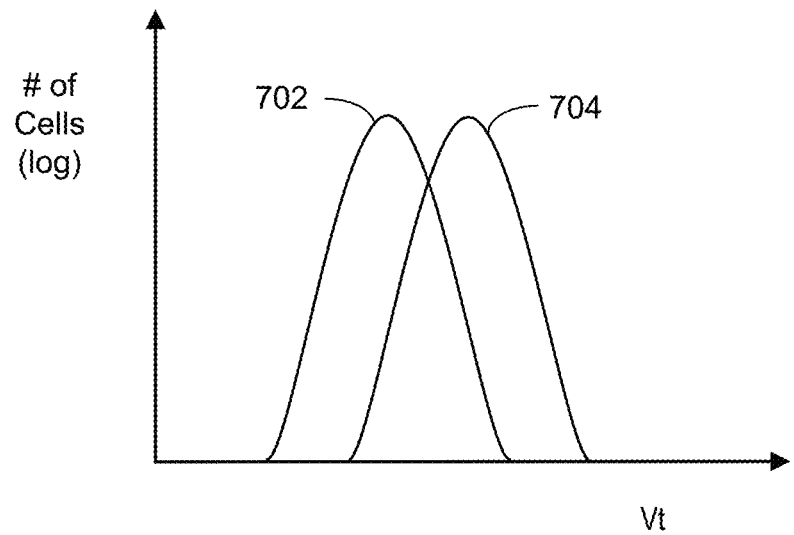
FIG. 7A depicts two natural Vt distributions illustrating different programming speeds.

For reasons including, but not limited to, process variations different sets of memory cells may program at different speeds. FIG. 7A depicts two natural Vt distributions illustrating different programming speeds. A natural Vt distribution refers to a Vt distribution due to application of, for example, one program pulse to a set of memory cells that start at the same Vt. Natural Vt distribution 702 is for a slower programming set of memory cells. In contrast, natural Vt distribution 704 is for a faster programming set of memory cells.

Figure 7B:
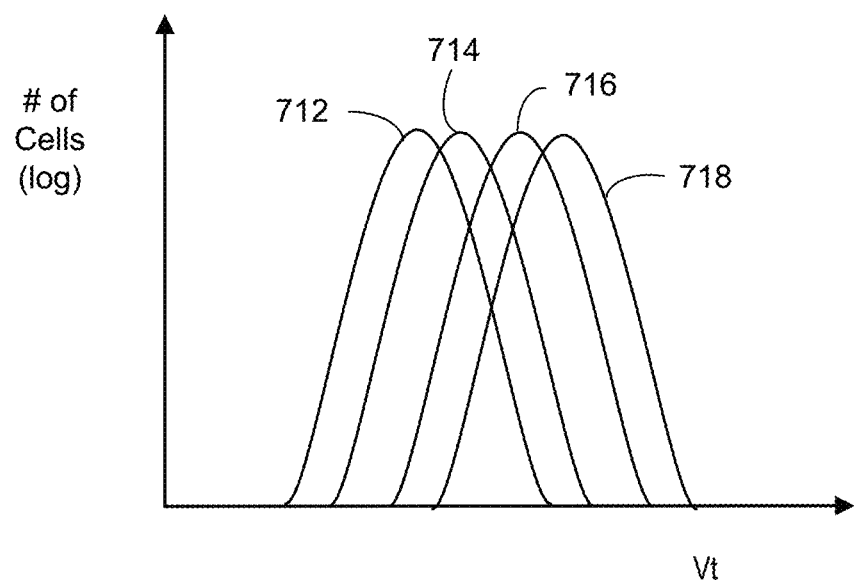
FIG. 7B shows four natural Vt distributions illustrating different programming speeds.

In some cases, programming speed depends on the physical location of the memory cells. Referring back to an embodiment of a portion 407 of a block depicted in FIG. 4B, there are four rows of memory cells in each region (420, 430, 440, 450, 460). It is possible that the natural Vt distribution for each row is different. FIG. 7B shows four natural Vt distributions 712, 714, 716, 718 distributions illustrating different programming speeds. With reference to FIG. 4B, each natural Vt distribution may be for one row of memory cells in a given region (420, 430, 440, 450, 460). Natural Vt distribution 712 is for the slowest programming row and natural Vt distribution 718 is for the fastest programming row of memory cells.

A factor in the different programming speeds may be the thickness of the tunneling layer 464 (see FIG. 4D). The thickness of the tunneling layer 464 may depend on how far the memory cell is from an edge of the block. Referring again to FIG. 4B, prior to filling in isolation regions 402 and 424 with the insulator, these regions 402, 424 may be used to introduce an etchant in the block region to etch away sacrificial layers of, for example, SiN. These sacrificial layers will then be replaced by Tungsten or some other conductor for the word lines. In some fabrication processes, the memory cells closer to the outer regions 402, 424 may have a thinner tunneling layer 464 than memory cells closer to the middle of the block (in the bit line direction). Within a given region (420, 430, 440, 450, 460) the term "outer MH" may be used herein to refer to those rows of MHs that are closest to the nearest outer region 402, 424 and the term "inner MH" may be used herein to refer to those rows of MHs that are farthest to the nearest outer region 402, 424. It is possible that outer MH memory cells may program faster (due to, for example, thinner tunneling layer 464) and inner MH memory cells may program slower (due to, for example, thicker tunneling layer 464). However, it will be appreciated by those of ordinary skill in the art that different fabrication processes may be used to form 3D memory structures, such that the location of the faster and slower programming cells could be located other than in the example just presented.

In some embodiments, the first bitscan will be for a strict subset of the cells in one row and the potential second bitscan will be for a strict subset of the cells in a different row (but with the same region (420, 430, 440, 450, 460)) that is presently being programmed and verified. In one embodiment in which the bitscan is used for program verify, the slower programming cells are the subject of the first bitscan with the faster programming cells being the subject of the potential second bitscan. In one embodiment in which the bitscan is used for SPCV, the faster programming cells are the subject of the first bitscan with the slower programming cells being the subject of the potential second bitscan.

Figure 8A:
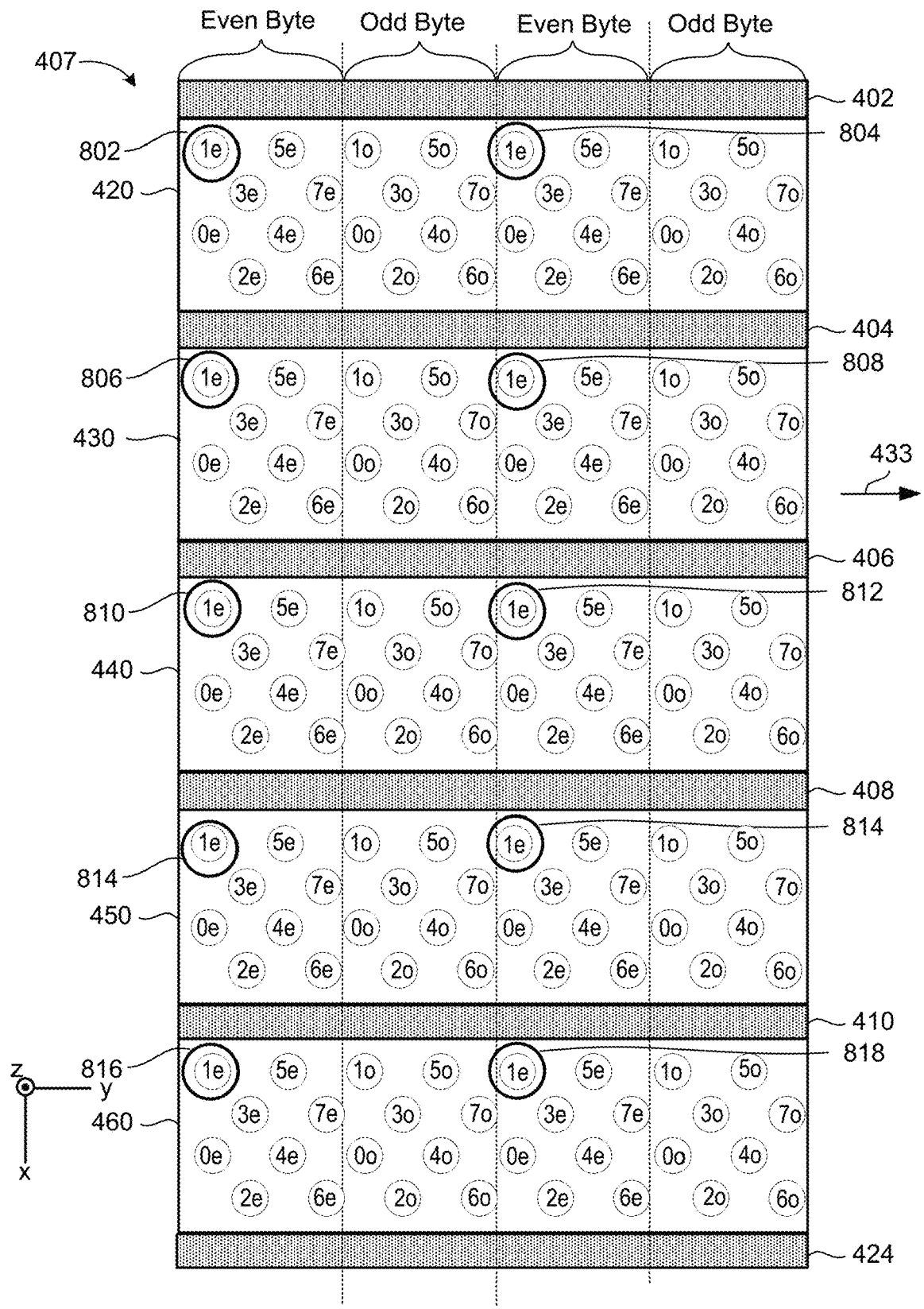
FIGS. 8A, 8B, 8C, and 8D depict four different examples of how memory cells can be divided into different strict subsets for bitscan.
Figure 8B:
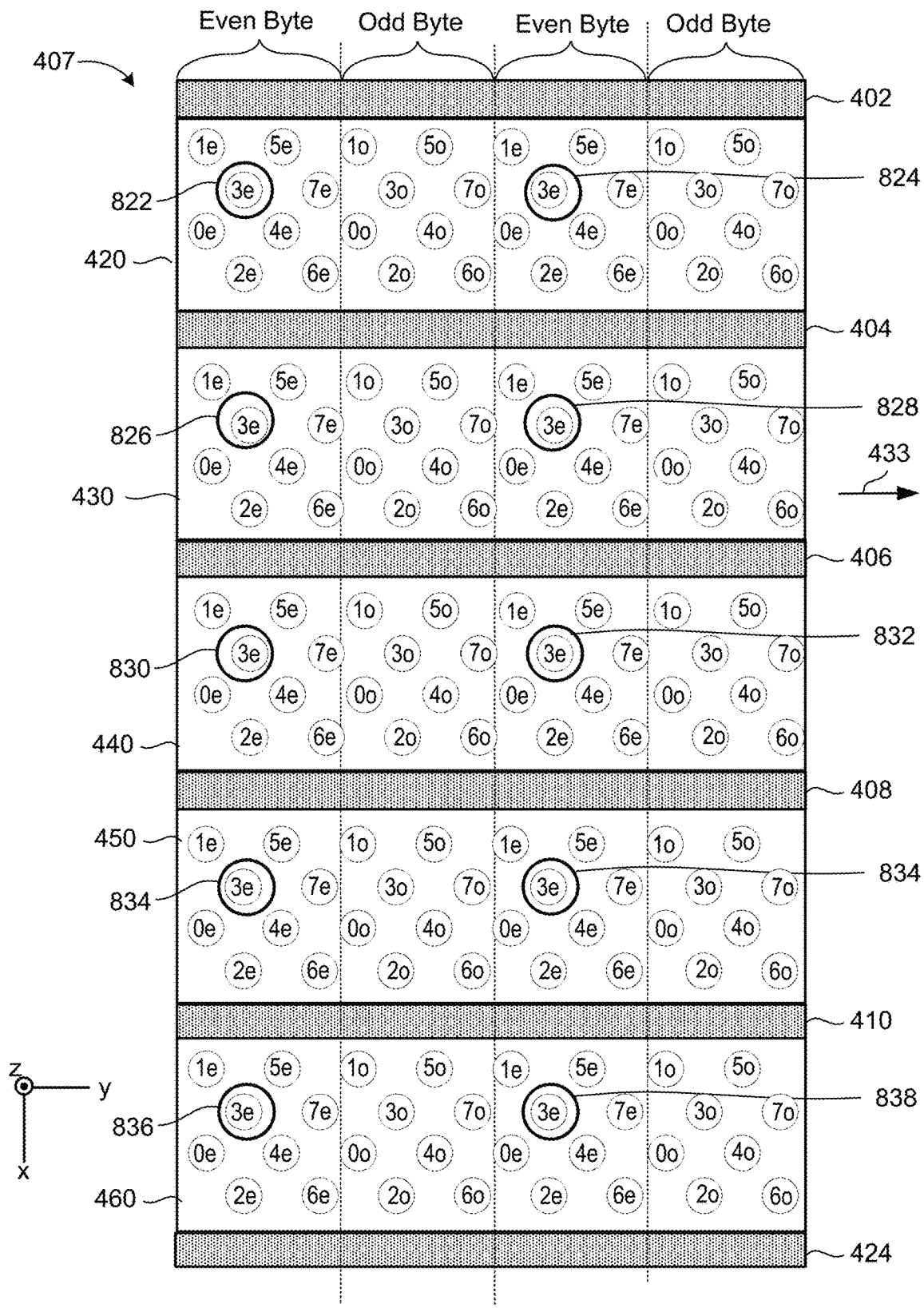
Figure 8C:
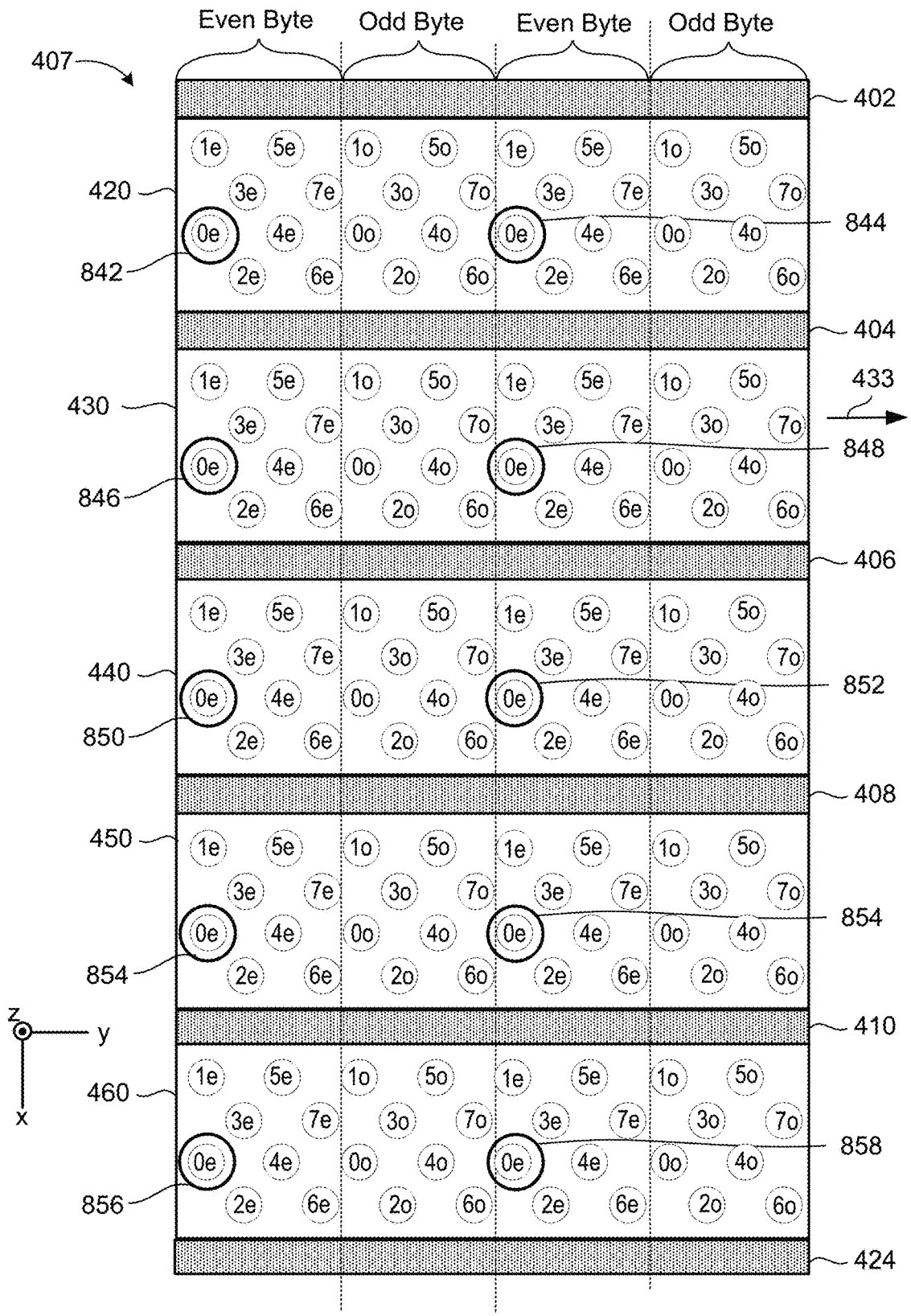
Figure 8D:
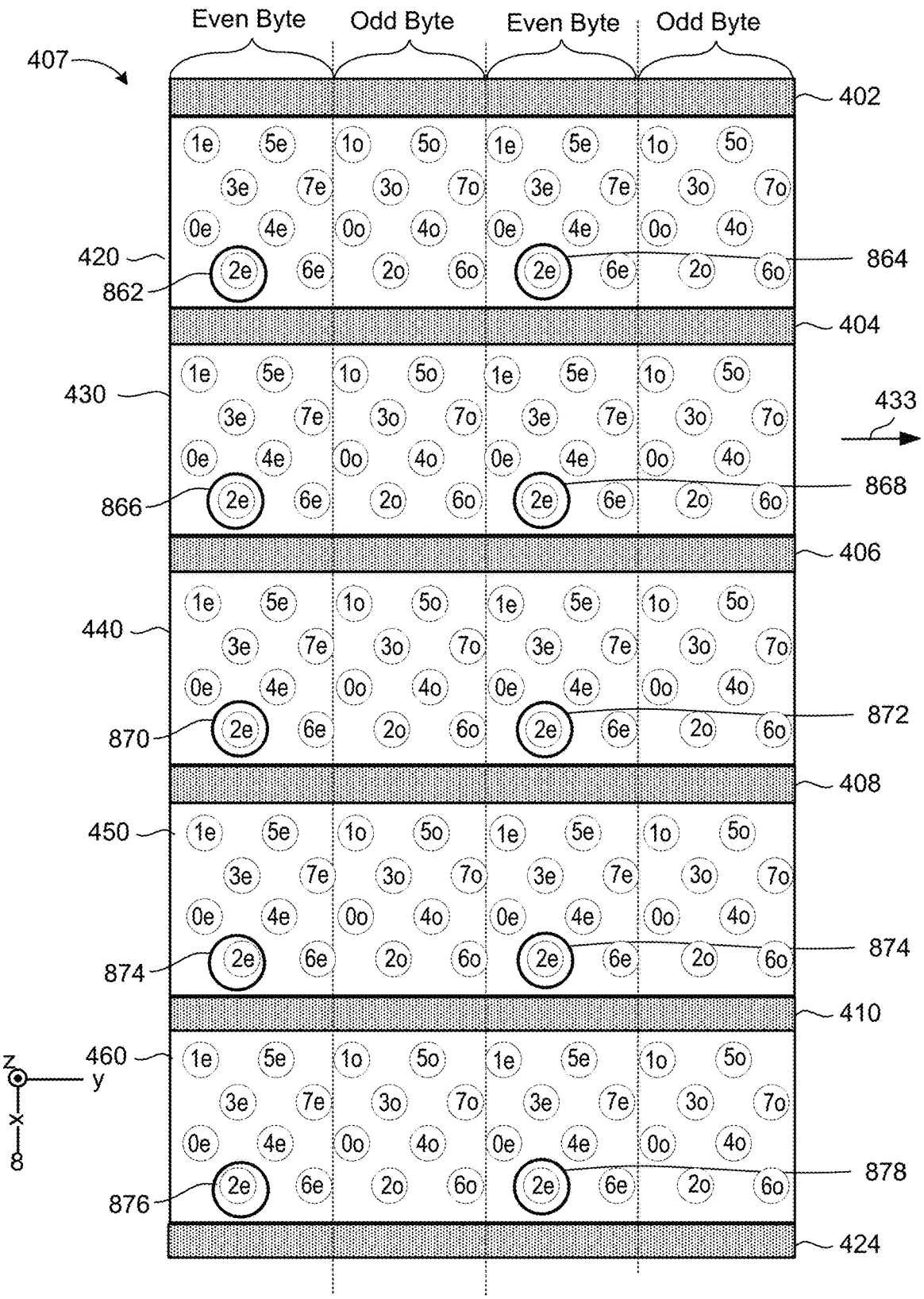

Embodiments of a bitscan may be used in connection with a program verify operation. The program operation may be used to program a group of cells such as a sub-block of cells connected to the same SGD. In an embodiment, these memory cells in the sub-block are divided into a number of groups with only one of those groups being subject to the bitscan. For example, the memory cells could be divided into 16 groups with only one of these groups being subject to the bitscan. FIGS. 8A-8D depict four different examples of how memory cells can be divided into different strict subsets for bitscan. FIGS. 8A-8D each show a portion 407 of block consistent with the example in FIG. 4B, although the bit lines are not depicted. The memory cells in each sub-block (420, 430, 440, 450, 460) are divided into a number of bytes. Two even bytes and two odd bytes are depicted for each sub-block. The even byte memory cells are labeled 0*e*, 1*e*, 2*e*, 3*e*, 4*e*, 5*e*, 6*e*, and 7*e*. The odd byte memory cells are labeled 0*o*, 1*o*, 2*o*, 3*o*, 4*o*, 5*o*, 6*o*, and 7*o*. Herein the term, Sense Amplifier (SA) Tier is used to refer to a group of Sense Amplifiers. In one embodiment, there are 16 SA Tiers to correspond to the 16 bits in the even and off bytes. With reference to FIG. 8A, all memory cells labeled 1*e* (802, 804, 806, 808, 810, 812, 814, 816, 818) are circled to indicate these memory cells are part of the same SA Tier (e.g. SA Tier 1). With reference to FIG. 8B, all memory cells labeled 3*e* (822, 824, 826, 828, 830, 832, 834, 836, 838) are circled to indicate these memory cells are part of the same SA Tier (e.g. SA Tier 3). With reference to FIG. 8C, all memory cells labeled 0*e* (842, 844, 846, 848, 850, 852, 854, 856, 858) are circled to indicate these memory cells are part of the same SA Tier (e.g. SA Tier 0). With reference to FIG. 8D, all memory cells labeled 2*e* (862, 864, 866, 868, 870, 872, 874, 876, 878) are circled to indicate these memory cells are part of the same SA Tier (e.g. SA Tier 2) There may be 12 other SA Tiers, which map to the other bits in the even and odd byte. Moreover, note that only one of the sub-blocks 420, 430, 440, 450, 460 are sensed at a time. Therefore, although each of FIG. 8A-8D depicts a total of 10 circled memory cells, only two of those cells (in the same sub-block) are involved in a specific bitscan. For example if sub-block 420 in FIG. 8A is being verified then cells 802 and 804 may be part of the bitscan. Note that there are also many other even byte and odd byte cells in the block that are not depicted. Hence, the bitscans will involve many more than two cells.

As discussed above, the programming speed of the memory cells may depend on their location in the block. Thus, memory cells 1e, 3e, 0e, and 2e may each have a different programming speed. As one example, memory cells 1e may have the natural Vt distribution 712, memory cells 3e may have the natural Vt distribution 714, memory cells 0e may have the natural Vt distribution 716, and memory cells 2e may have the natural Vt distribution 718. The foregoing is one example of how location may correlate to programming speed. However, other correlations are possible. In one embodiment, the first bitscan may be of one of SA Tier 0, SA Tier 1, SA Tier 2, or SA Tier 3. The optional second bitscan may be a different one SA Tier 0, SA Tier 1, SA Tier 2, or SA Tier 3. Thus, the two bitscans may be for memory cells rows having different programming speeds. In one embodiment, the first bitscan is for an "outer MH" such as cells 1e and the optional second bitscan is for an "inner MH" such as cells 2e. In one embodiment, the first bitscan is for an "inner MH" such as cells 2e and the optional second bitscan is for an "outer MH" such as cells 1e. In one embodiment, sampling both the inner MH cells and the outer MH cells will sample both the fastest and slowest programming cells, if both bitscans are performed. However, the decision of whether to select the fastest or the slowest programming cells for the first bitscan can be made to increase the likelihood that the second bitscan may be skipped thereby saving time.

Figure 9A:
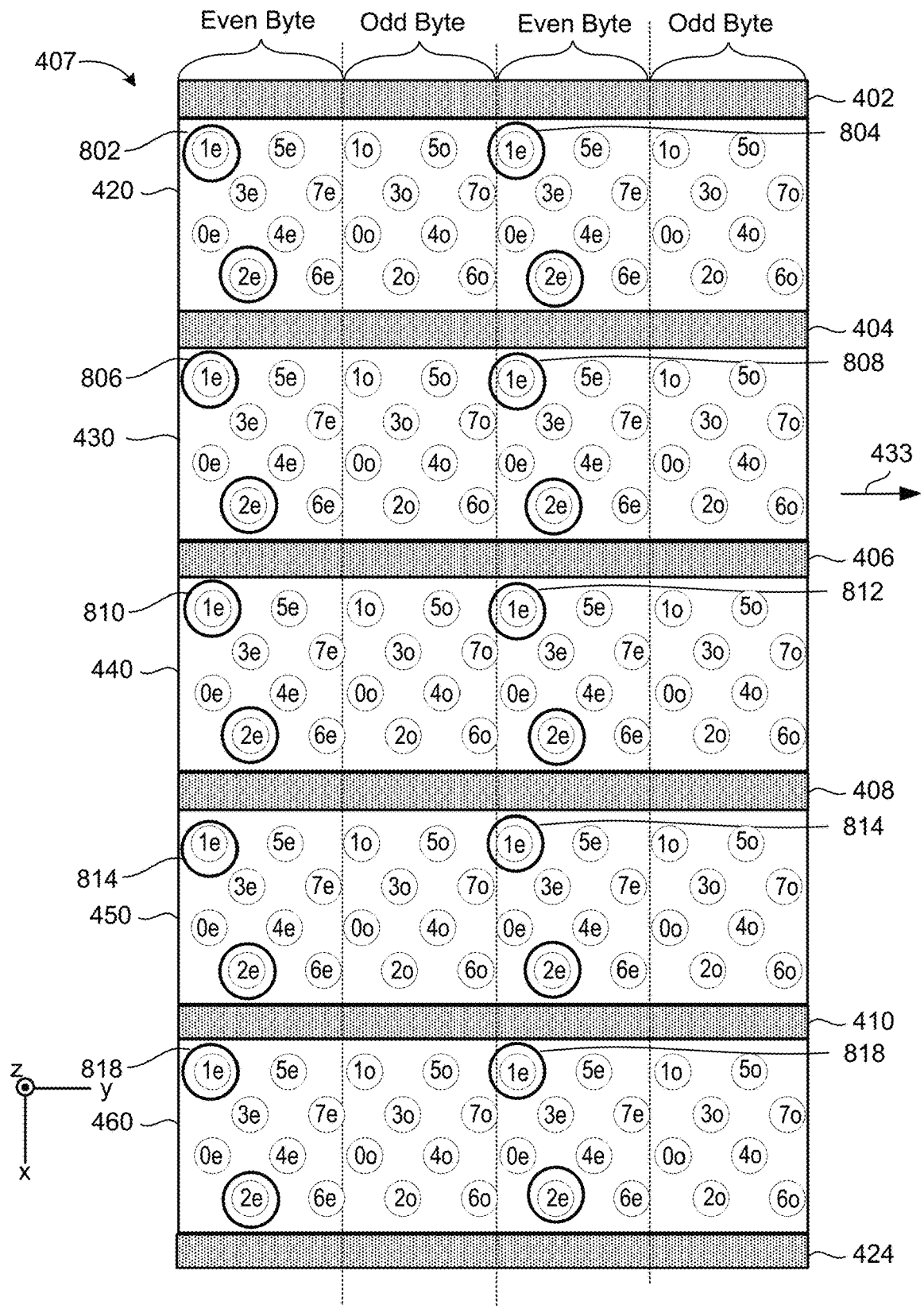
FIGS. 9A and 9B show two examples in which a bitscan involves two Sense Amplifier (SA) Tiers.
Figure 9B:
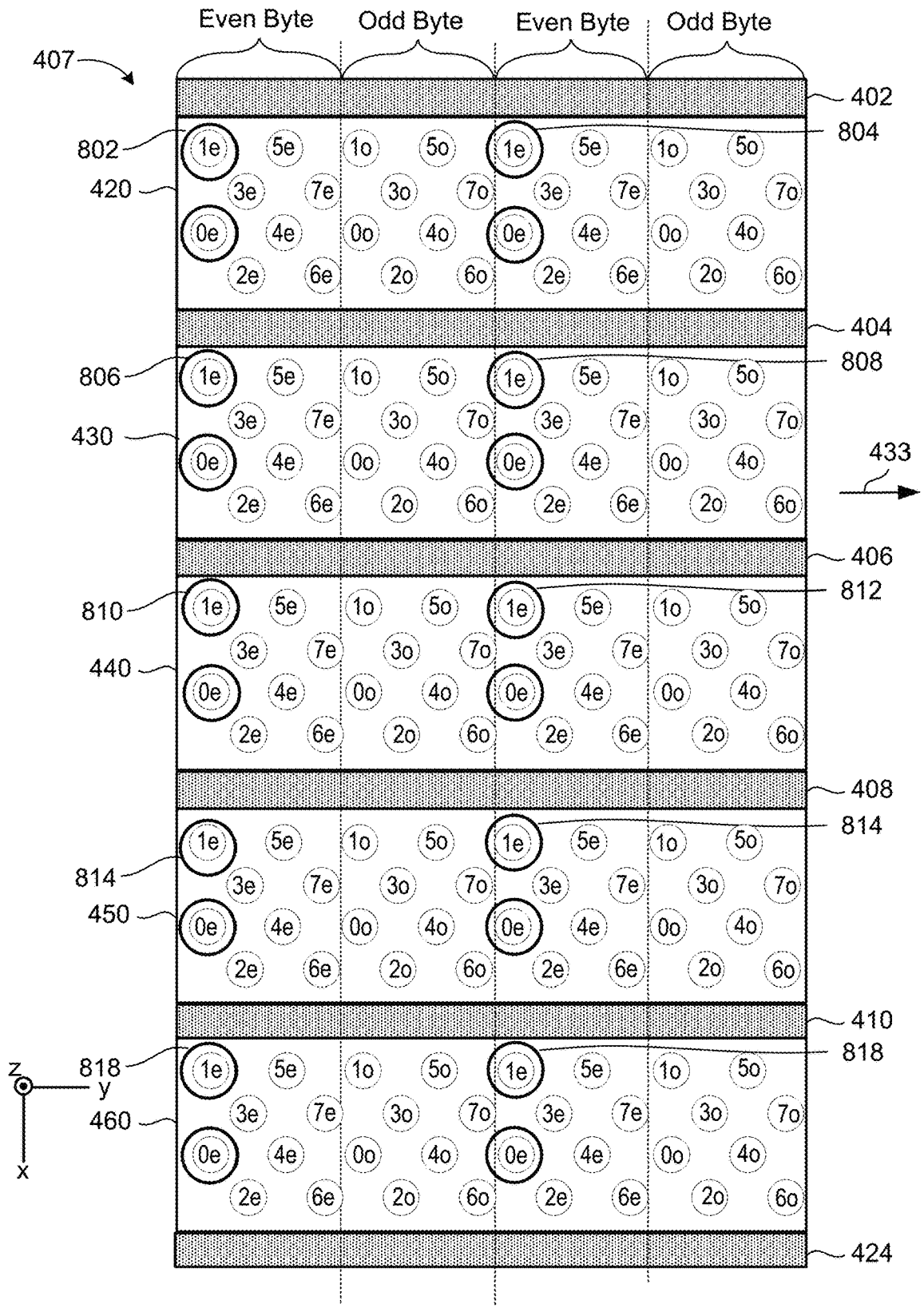

Bitscans that involve more than one SA Tier are also possible. FIGS. 9A and 9B show two examples in which a bitscan involves two SA Tiers. FIG. 9A shows an example in which memory cells 1e (SA Tier 1) and cells 2e (SA Tier 2) are involved in a two SA Tier bitscan. A bitscan for SA Tier 1 and SA Tier 2 will count the sensing results for both the 1e cells and the 2e cells. FIG. 9B shows an example in which memory cells 1e (SA Tier 1) and cells 0e (SA Tier 0) are involved in a two SA Tier bitscan. A bitscan for SA Tier 1 and SA Tier 0 will count the sensing results for both the 1e cells and the 0e cells. Many other combinations are possible for a two SA Tier bitscan. Bitscans that count sensing results for more than two SA Tiers are also possible.

Figure 10:
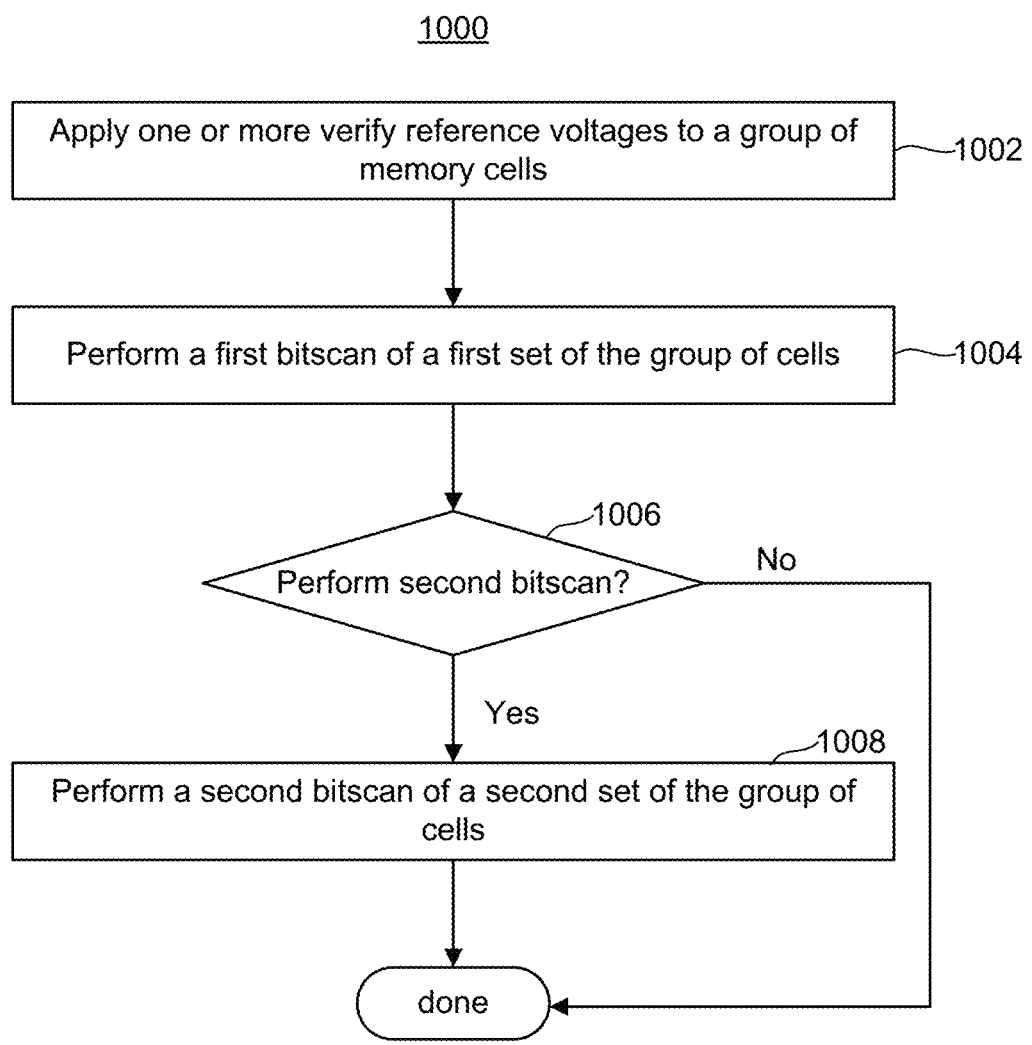
FIG. 10 is a flowchart of one embodiment of a process of performing one or more bitscans in connection with a program verify.

FIG. 10 is a flowchart of one embodiment of a process 1000 of performing one or more bitscans in connection with a program verify. In one embodiment, the process 1000 is performed by one or more control circuits which may include, but is not limited to, column control circuitry 210 (which may include bitscan circuitry 131), system control logic 260, and row control circuitry 220. In one embodiment, the process 1000 is used during a program operation of a group of memory cells. In one embodiment, the group of memory cells are NAND cells. In one embodiment, the group of memory cells are NAND cells in a 3D memory structure. However, the memory cells are not limited to NAND. Prior to process 1000 a program pulse may be applied to the group of memory cells. The process 1000 may be repeated multiple times during the programming of the group of memory cells.

Step 1002 includes applying one or more verify reference voltages to the group of memory cells. In one embodiment, process 1000 is performed on a state by state basis, wherein only one verify reference voltage is applied tin step 1002. In one embodiment, the group of memory cells are connected to the same word line in a 3D memory structure. Furthermore, the group may be connected to the same SGD. In one embodiment, the group is in the same sub-block in a 3D memory structure (in addition to being connected to the same word line). Examples of verify reference voltages are shown and described with respect to FIGS. 5A and 5B; however, process 1000 is not limited to those examples. Step 1002 may also include sensing the memory cells in response to each of the one or more verify reference voltages. The sensing results may be stored in sense amplifiers. In one embodiment, a lockout status is stored for each memory cell based on whether its Vt is at or above the verify reference voltage for the data state to which the memory cell is being programmed. In one embodiment, when the Vt of the memory cell reaches the verify reference voltage for the data state to which the memory cell is being programmed its lockout status is set to "lockout".

Step 1004 includes performing a first bitscan of a first strict subset of memory cells in the group to which the one or more verify reference voltages was applied. In one embodiment, the first strict subset of memory cells are cells in one SA Tier. In one embodiment, the bitscan will only scan memory cells that are presently being verified by the one or more verify reference voltages. Therefore, it is not required that all memory cells in the SA Tier be included in the bitscan. Also note that the SA Tier itself samples only some of the memory cells being programming. For example, if there are 16 SA Tiers, then only 1/16 of the memory cells being programmed are in each SA Tier.

In one embodiment, the first bitscan pertains to program verify. The first bitscan may determine a fail bit count (FBC), wherein the FBC indicates how many memory cells have a Vt below the verify reference voltage of the data state to which the particular memory cell is being programmed. In one embodiment, the first bitscan pertains to an SPCV. In an embodiment of an SPCV, the first bitscan may determine a count of how many memory cells being programmed to a target data state have a Vt above the verify reference voltage of the target data state. In one embodiment, the first bitscan is for a smart verify that is used to optimize an initial program voltage when programming other groups of memory cells (such as other sub-blocks in the block).

Step 1006 includes a determination of whether to perform a second bitscan in connection with the one or more verify reference voltages. The determination nay be based on results of the first bitscan. In an embodiment in which the first bitscan was for program verify, the second bitscan may be performed if the FBC is less than allowed for the first bitscan. In one embodiment the allowed number is based on the number of cells in the first strict subset (subject to the first bitscan). For example, if the FBC is 48 for the entire page of cells, and if the first strict subset of cells is 1/16 of a page, then the FBC for the first bitscan could be 3. However, this is just one example. In an embodiment in which the first bitscan was for SPCV, the second bitscan may be performed if the count is less than a threshold for the first bitscan. In one embodiment the count is based on the number of cells in the first strict subset (subject to the first bitscan). For example, if the count is 48 for the entire page of cells, and if the first strict subset of cells is 1/16 of a page than the count for the first bitscan could be 3. However, this is just one example.

If the determination is to perform the second bitscan, the in step 1008 the second bitscan is performed for a second strict subset of memory cells in the group. The second bitscan is the same type of bitscan as the first bitscan. However, the second bitscan is for a different strict subset of memory cells. In an embodiment, the second strict subset of cells have a different distance (in the bitline direction) from an edge of the block than the first strict subset of cells. In an embodiment, the second strict subset of cells have a different programming speed than the first strict subset of cells.

Figure 11:
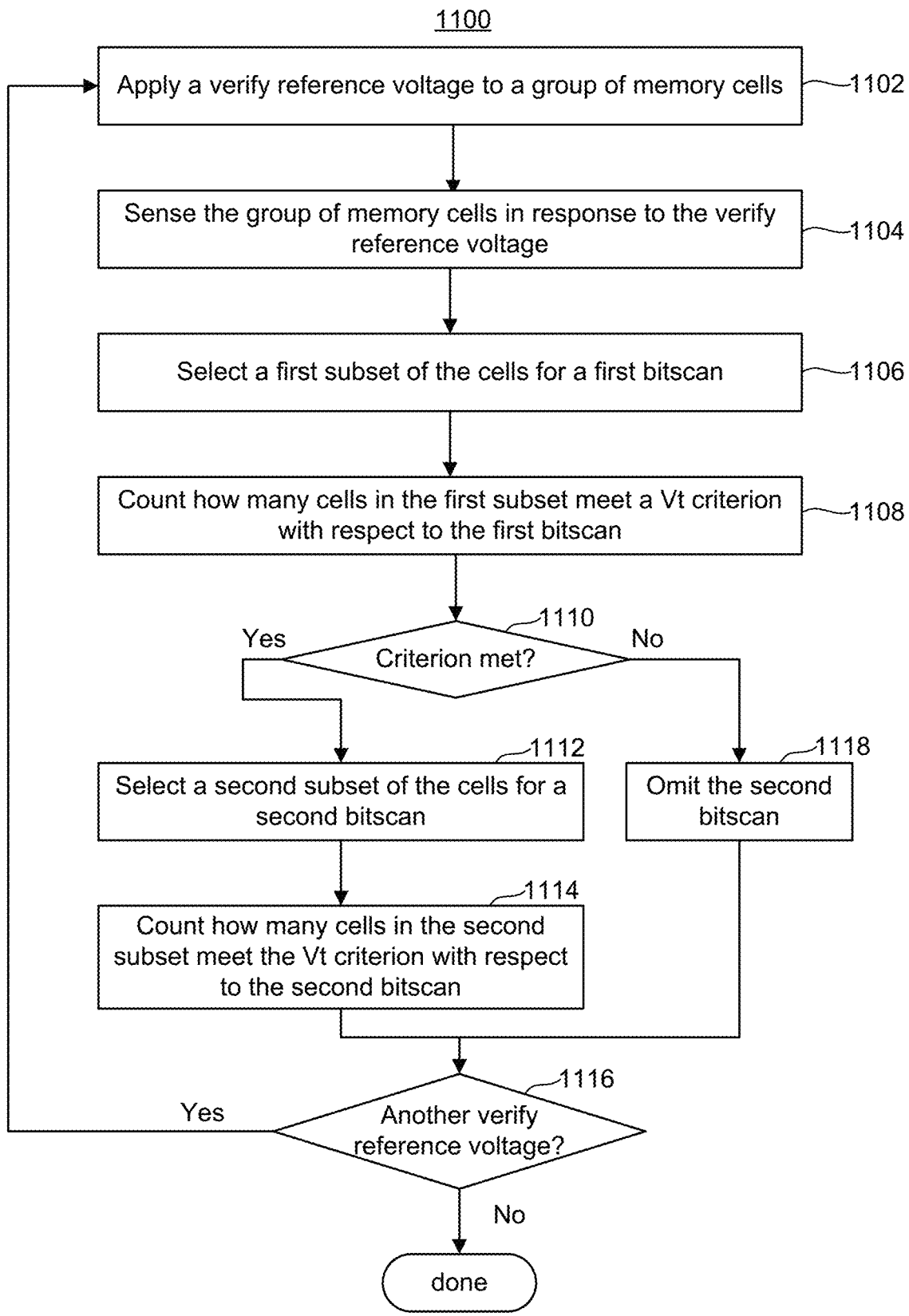
FIG. 11 is a flowchart of one embodiment of a process of performing one or more bitscans in connection with a program verify.

FIG. 11 is a flowchart of one embodiment of a process 1100 of performing one or more bitscans in connection with a program verify. The process 1100 provides further details for an embodiment of process 1000 in FIG. 10. The process 1100 is for one program loop and involves one or more verify reference voltages. Process 1100 is for one embodiment of a state dependent bitscan in which the bitscan(s) are for a particular data state. Prior to process 1100 a program pulse is applied to the group of memory cells. Note that some of the memory cells may be inhibited from programing as discussed in discussion of FIG. 6. In one embodiment, the process 1100 is performed by one or more control circuits which may include, but is not limited to, column control circuitry 210 (which may include bitscan circuitry 131), system control logic 260, and row control circuitry 220. In one embodiment, the group of memory cells being programming are NAND cells. In one embodiment, the group of memory cells are NAND cells in a 3D memory structure. However, the memory cells are not limited to NAND.

Step 1102 includes applying a verify reference voltage to a group of memory cells. In one embodiment, the group of memory cells are connected to the same word line in a 3D memory structure. Furthermore, the group may be connected to the same SGD. In one embodiment, the group is in the same sub-block in a 3D memory structure (in addition to being connected to the same word line). Examples of verify reference voltages are shown and described with respect to FIGS. 5A and 5B; however, process 1000 is not limited to those examples.

Step 1104 includes sensing the group of memory cells in response to the verify reference voltage. Step 1104 may produce a sensing result for each memory cell in the group. The sensing result for a cell may be stored in a sense node latch 322 (see FIG. 3C). In an embodiment, the sensing result includes a lockout status for the memory cell.

Step 1106 includes selecting a first strict subset of the cells for a first bitscan. In one embodiment, the first strict subset is selected based on a programming speed of the first strict subset. In one embodiment, the first strict subset is selected based on a physical location of the first strict subset.

Step 1108 includes a count of how many cells in the first strict subset meet a Vt criterion with respect to the first bitscan. This count may be based on the sensing results of step 1104. In one embodiment, the Vt criterion is whether the cell has a Vt below the verify reference voltage. In one embodiment, the Vt criterion is whether the cell has a Vt at or above the verify reference voltage.

Step 1110 includes a determination of whether the Vt criterion is met. If yes, then in step 1112 a second strict subset of the cells are selected for a second bitscan. In one embodiment, the second strict subset is selected based on a programming speed of the second strict subset. In one embodiment, the second strict subset is selected based on a programming speed of the second strict subset relative to the programming speed of the first strict subset. In one embodiment, the second strict subset is selected based on a physical location of the second strict subset.

Step 1114 includes a count of how many cells in the second strict subset meet the Vt criterion with respect to the second bitscan. This count may be based on the sensing results of step 1104.

Step 1116 is a determination of whether there is another verify reference voltage to apply for this program pulse. If so, the process 1100 returns to step 1102 to apply the next verify reference voltage to the group of memory cells. Note that it is not required to verify each data state during each program loop. Returning again to the discussion of step 1110, if the Vt criterion for the first bitscan is not met, then the second bitscan is omitted (as indicated by step 1118).

Figure 12:
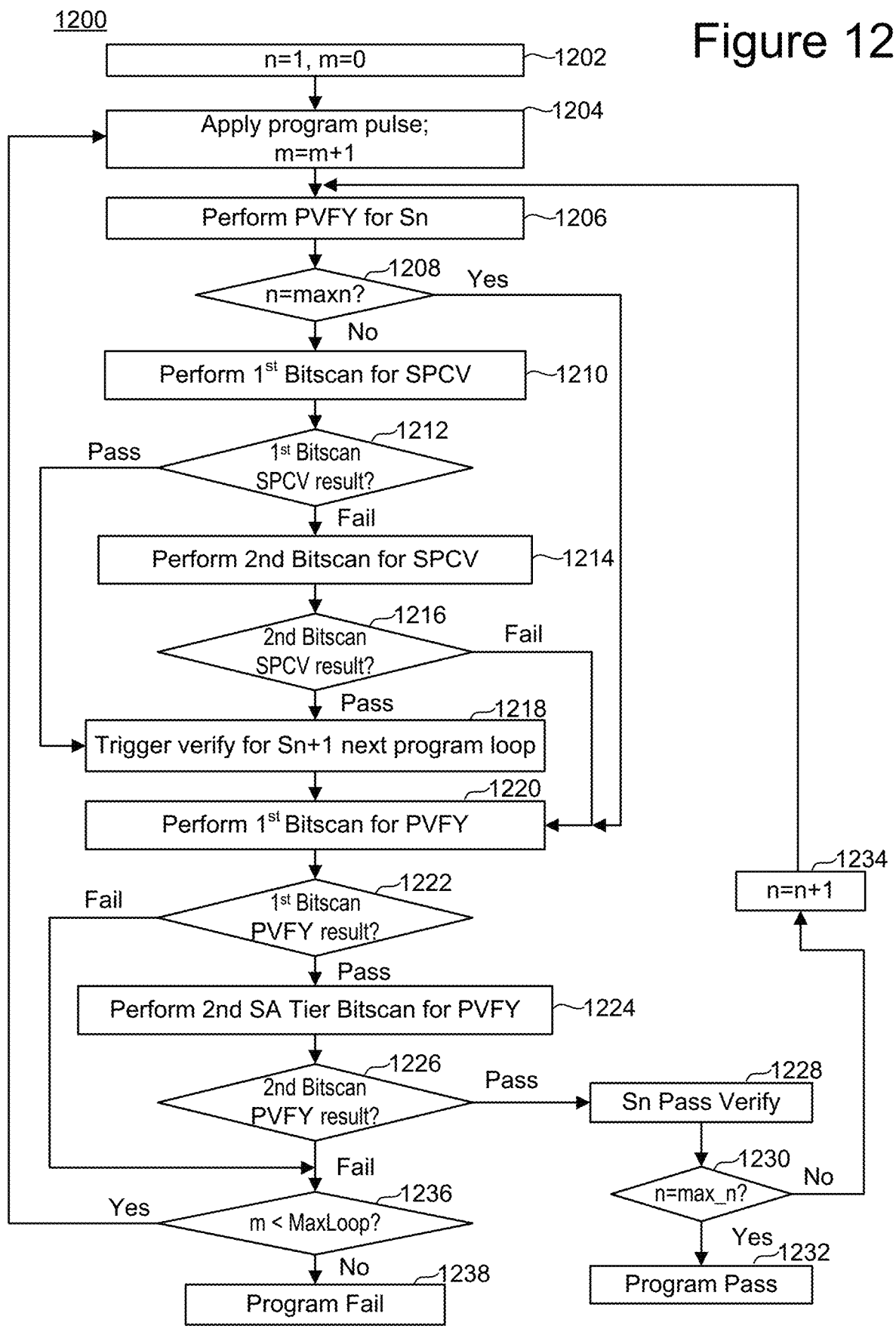
FIG. 12 is a flowchart of one embodiment of a process of performing one or more bitscans in connection with a program verify.

FIG. 12 is a flowchart of one embodiment of a process 1200 of performing one or more bitscans in connection with a program verify. Process 1200 includes an SPCV bitscan and a program verify (PVFY) bitscan. The process 1200 provides further details for an embodiment of process 1000 in FIG. 10. In one embodiment, the process 1200 is performed by one or more control circuits which may include, but is not limited to, column control circuitry 210 (which may include bitscan circuitry 131), system control logic 260, and row control circuitry 220. In one embodiment, the group of memory cells being programming are NAND cells. In one embodiment, the group of memory cells are NAND cells in a 3D memory structure. However, the memory cells are not limited to NAND.

Step 1202 includes initializing parameters. The parameter (n) is for the state being verified and may be set to 1. In an embodiment, the cells are programmed to 3 bits per cell and n=7. In an embodiment, the cells are programmed to 4 bits per cell and n=15. However, n could have a different value. The parameter (m) is for the number of program loops and is set to 0. The process 1200 allows a certain number of loops (MaxLoop) to complete prior to a status of program fail.

Step 1204 includes applying a program pulse to the group of memory cells. Step 1206 includes performing a program verify (PVFY) for Sn (data state n). Step 1206 may include applying a verify reference voltage for Sn to the selected word line that is connected to the group of memory cells. Step 1206 may also include sensing each memory cell in the group. For each memory cell, a result of the sensing may be stored in a latch in the SA associated with that memory cell. The comparison circuit (320 FIG. 3C) may be used to determine whether the memory cell's Vt is above or below the verify reference voltage for Sn. A result may be stored in the sense node latch (322, FIG. 3C).

Step 1208 is a determination of whether this is the highest Vt state (is n=maxn). For the example in FIG. 5A, the highest Vt state is the G-state. For the example in FIG. 5B, the highest Vt state is S15. Steps 1210-1218 are for a SPCV, which determines whether to initiate verify for sn+1 the next program loop. If this the highest Vt state, then steps 1210-1218 are skipped. Otherwise, the SPCV bitscan(s) are performed. Step 1210 includes performing a first SPCV bitscan. In an embodiment, this is a bitscan for one SA Tier.

Step 1212 includes examining the results of the first SPCV bitscan results to determine whether to perform a second SPCV bitscan. In an embodiment, pass or fail of the first SPCV bitscan depends on whether a certain number of cells have a Vt above the verify reference voltage for Sn. If more than an SPCV threshold have a Vt above the verify reference voltage, then the SPCV bitscan passes. Otherwise, the SPCV bitscan fails. In an embodiment, if the first SPCV bitscan fails then then second SPCV bitscan is performed in step 1214. In an embodiment, the second SPCV bitscan is for a different SA Tier than the first SPCV bitscan. In an embodiment, when two SA Tiers bitscan is applied, the first SPCV bitscan is for one SA Tier and the second SPCV bitscan is for another SA Tier. For example, if there are 16 SA Tiers, then only 1/16 of the memory cells being scanned are in each SPCV bitscan.

Step 1216 includes examining the results of the second SPCV bitscan. In an embodiment, if the second SPCV bitscan passes then verify for Sn+1 is triggered for the next program loop (see step 1218). In one embodiment, verify for Sn+p is triggered for the next program loop, where p is an integer greater than zero. However, if the second SPCV bitscan fails then step 1218 is skipped. Returning again to the discussion of step 1212, the first SPCV bitscan passes then then second SPCV bitscan is skipped and step 1218 is performed.

Continuing on, steps 1220-1226 pertain to bitscan(s) for program verify (PVFY). Step 1220 includes performing a first PVFY bitscan. This PVFY bitscan may be for one SA Tier. Note that this SA Tier bitscan for PVFY does not necessarily use the same memory cells (or SA Tier) as was used in the first SPCV bitscan in step 1210. In one embodiment, relatively fast programming cells are used for the first SPCV bitscan and relatively slow programming cells are used for the second SPCV bitscan. In one embodiment, relatively slow programming cells are used for the first PVFY bitscan and relatively slow fast cells are used for the second PVFY bitscan.

Step 1222 includes examining the results of the first PVFY bitscan to determine whether to perform a second PVFY bitscan. In an embodiment, pass or fail of the first PVFY bitscan depends on whether a certain number of cells have a Vt below the verify reference voltage for Sn. If more than an FBC have a Vt below the verify reference voltage, then the PVFY bitscan fails. Otherwise, the PVFY bitscan passes. In an embodiment, if the first bitscan passes then the second PVFY bitscan is performed in step 1224. Step 1226 includes examining the results of the second PVFY bitscan. In an embodiment, if the second PVFY bitscan passes then verify for Sn has passed (step 1228). After step 1228 a check is made in step 1230 whether this is the highest Vt state (n=max_n). If this is the higher Vt state the process ends with a status of pass in step 1232. If this is not the higher Vt state, then there may be more data states to verify. The state count (n) is incremented in step 1234. Then, the next state may be verified starting at step 1206. However, it is not required that all data states be verified for each program loop. When all data states for this program loop are verified, then step 1204 may be performed to apply the next program pulse.

Returning again to the discussion of step 1226, if the second PVFY bitscan fails then verify for Sn is not yet complete. Optionally, other data states can be verified during this program loop. Assuming no more data states are to be verified this program loop, then the program loop count is checked in step 1236. If the program loop count is less than the maximum (m<MaxLoop) then the process repeats step 1204 to apply the next program pulse. If the program loop count is at the maximum then the process ends at step 1238 with a status of program fail. Returning again to the discussion of step 1222, the first PVFY bitscan fails then then second PVFY bitscan is skipped.

In view of the foregoing, a first embodiment includes an apparatus comprising one or more control circuits configured to connect to a three-dimensional memory structure comprising blocks of memory cells. The one or more control circuits are configured to apply one or more verify reference voltages to a group of memory cells in a selected block in the three-dimensional memory structure. The one or more control circuits are configured to perform a first bitscan of a first strict subset of the group of memory cells that have a first programming speed. The first bitscan comprises a first count of first sensing results from applying the one or more verify reference voltages to the first strict subset of the group. The one or more control circuits are configured to perform a second bitscan of a second strict subset of the group of memory cells that have a second programming speed responsive to the first count meeting a criterion. The second bitscan is not performed if the criterion is not met, the second bitscan comprising a second count of second sensing results from applying the one or more verify reference voltages to the second strict subset of the group.

In a further embodiment, the one or more control circuits are further configured to select the first strict subset for the first bitscan and the second strict subset for the second bitscan based on which strict subset programs faster and which strict subset programs slower.

In a further embodiment, the one or more control circuits are further configured to select slower programming group for the first strict subset for the first bitscan and faster programming group for the second strict subset for the second bitscan. And the one or more control circuits are further configured to determine whether program verify has passed based on the first count and further on the second count when the second bitscan is performed.

In a further embodiment, the one or more control circuits are further configured to determine a fail bit count based on the first count, wherein a particular memory cell is counted as a fail bit if its threshold voltage (Vt) is below the verify reference voltage associated with a data state to which the particular memory cell is being programmed. And the one or more control circuits are further configured to perform the second bitscan responsive to the fail bit count being less than allowed.

In a further embodiment, the first count is of how many memory cells in the first strict subset have a threshold voltage (Vt) above a first verify reference voltage for a data state Sn. The one or more control circuits are further configured to select a faster programming group for the first strict subset for the first bitscan and a slower programming group for the second strict subset for the second bitscan. And the one or more control circuits are further configured to determine, based on the first count and further on the second count when the second bitscan is performed, whether to initiate verify in a next program loop for a data state Sn+1 having a second verify reference voltage that is greater than the first verify reference voltage.

In a further embodiment, the one or more control circuits are further configured to perform the second bitscan responsive to the first bit count being less than a threshold for initiating verify for data state Sn+1.

In a further embodiment, one of the first strict subset and the second strict subset are inner memory holes; and, the other of the first strict subset and the second strict subset are outer memory holes.

In a further embodiment, the first strict subset and the second strict subset are different distances from an edge of the selected block in a bit line direction.

In a further embodiment, the first strict subset of memory cells comprises a first group of one or more bits in each of a plurality of bytes of memory cells, wherein each byte of memory cells is grouped together physically. And the second strict subset of memory cells comprises a second group of one or more bits in each of the plurality of bytes of memory cells.

One embodiment includes a method for operating nonvolatile memory. The method comprises applying a first verify reference voltage to a word line connected to a group of NAND memory cells that are organized as a plurality of bytes, wherein each byte of memory cells is grouped together physically within a block in a three-dimensional memory structure. The method comprises sensing the group of memory cells in response to the first verify reference voltage. The method comprises selecting a first strict subset of one or more bits in each of a subset of the plurality of bytes of memory cells. The method comprises determining a first count of how many of the memory cells in the first strict subset meet a threshold voltage (Vt) criterion with respect to the first verify reference voltage, the first count being based on the sensing of the first strict subset. The method comprises: responsive to the first strict subset meeting the criterion with respect to the first verify reference voltage: selecting a second strict subset of one or more bits in each of the subset of the plurality of bytes of memory cells; and determining a second count how many of the memory cells in the second strict subset meet the Vt criterion with respect to the first verify reference voltage, the second count being based on the sensing of the second strict subset. The method comprises applying a second verify reference voltage to the word line connected to the group of memory cells. The method comprises sensing the group of memory cells in response to the second verify reference voltage. The method comprises determining a third count of how many of the memory cells in the first strict subset meet a Vt criterion with respect to the second verify reference voltage. And the method comprises responsive to the first strict subset not meeting the Vt criterion with respect to the second verify reference voltage: omitting counting of how many of the memory cells in the second strict subset meet the Vt criterion with respect to the second verify reference voltage.

One embodiment includes a non-volatile storage system comprising a three-dimensional memory structure comprising blocks of memory cells arranged as NAND strings, the three-dimensional memory structure having bit lines extending over the blocks. The non-volatile storage system also comprises one or more control circuits in communication with the three-dimensional memory structure. The one or more control circuits are configured to apply a verify reference voltage to a group of memory cells in a selected block in the three-dimensional memory structure. The one or more control circuits are configured to perform a first bitscan of a first strict subset of the group of memory cells that each have a first distance in a bit line direction from an edge of the selected block. The one or more control circuits are configured to perform a second bitscan of a second strict subset of the group of memory cells that each have a second distance in the bit line direction from the edge of the selected block responsive to a condition being met with respect to the first bitscan, wherein the second bitscan is not performed if the condition is not met.

For purposes of this document, reference in the specification to "an embodiment," "one embodiment," "some embodiments," or "another embodiment" may be used to describe different embodiments or the same embodiment.

For purposes of this document, a connection may be a direct connection or an indirect connection (e.g., via one or more other parts). In some cases, when an element is referred to as being connected or coupled to another element, the element may be directly connected to the other element or indirectly connected to the other element via one or more intervening elements. When an element is referred to as being directly connected to another element, then there are no intervening elements between the element and the other element. Two devices are "in communication" if they are directly or indirectly connected so that they can communicate electronic signals between them.

For purposes of this document, the term "based on" may be read as "based at least in part on."

For purposes of this document, without additional context, use of numerical terms such as a "first" object, a "second" object, and a "third" object may not imply an ordering of objects, but may instead be used for identification purposes to identify different objects.

The foregoing detailed description has been presented for purposes of illustration and description. It is not intended to be exhaustive or to limit to the precise form disclosed. Many modifications and variations are possible in light of the above teaching. The described embodiments were chosen in order to best explain the principles of the proposed technology and its practical application, to thereby enable others skilled in the art to best utilize it in various embodiments and with various modifications as are suited to the particular use contemplated. It is intended that the scope be defined by the claims appended hereto.

What is claimed is:

1. An apparatus, comprising:
    one or more control circuits configured to connect to a three-dimensional memory structure comprising blocks of memory cells, wherein the one or more control circuits are configured to:
        apply one or more verify reference voltages to a group of memory cells in a selected block in the three-dimensional memory structure;
        perform a first bitscan of a first strict subset of the group of memory cells that have a first programming speed, the first bitscan comprising a first count of first sensing results from applying the one or more verify reference voltages to the first strict subset of the group; and
        perform a second bitscan of a second strict subset of the group of memory cells that have a second programming speed responsive to the first count meeting a criterion, wherein the second bitscan is not performed if the criterion is not met, the second bitscan comprising a second count of second sensing results from applying the one or more verify reference voltages to the second strict subset of the group.

2. The apparatus of claim 1, wherein the one or more control circuits are further configured to:
    select the first strict subset for the first bitscan and the second strict subset for the second bitscan based on which strict subset programs faster and which strict subset programs slower.

3. The apparatus of claim 1, wherein the one or more control circuits are further configured to:
    select slower programming group for the first strict subset for the first bitscan and faster programming group for the second strict subset for the second bitscan; and
    determine whether program verify has passed based on the first count and further on the second count when the second bitscan is performed.

4. The apparatus of claim 3, wherein the one or more control circuits are further configured to:
    determine a fail bit count based on the first count, wherein a particular memory cell is counted as a fail bit if its threshold voltage (Vt) is below the verify reference voltage associated with a data state to which the particular memory cell is being programmed; and
    perform the second bitscan responsive to the fail bit count being less than allowed.

5. The apparatus of claim 1, wherein:
    the first count is of how many memory cells in the first strict subset have a threshold voltage (Vt) above a first verify reference voltage for a data state Sn;

the one or more control circuits are further configured to:
select a faster programming group for the first strict subset for the first bitscan and a slower programming group for the second strict subset for the second bitscan; and
determine, based on the first count and further on the second count when the second bitscan is performed, whether to initiate verify in a next program loop for a data state Sn+1 having a second verify reference voltage that is greater than the first verify reference voltage.

6. The apparatus of claim 5, wherein the one or more control circuits are further configured to perform the second bitscan responsive to the first bit count being less than a threshold for initiating verify for data state Sn+1.

7. The apparatus of claim 1, wherein:
one of the first strict subset and the second strict subset are inner memory holes; and
the other of the first strict subset and the second strict subset are outer memory holes.

8. The apparatus of claim 1, wherein:
the first strict subset and the second strict subset are different distances from an edge of the selected block in a bit line direction.

9. The apparatus of claim 1, wherein:
the first strict subset of memory cells comprises a first group of one or more bits in each of a plurality of bytes of memory cells, wherein each byte of memory cells is grouped together physically; and
the second strict subset of memory cells comprises a second group of one or more bits in each of the plurality of bytes of memory cells.

10. The apparatus of claim 1, wherein:
the one or more control circuits reside on a first semiconductor die; and
the three-dimensional memory structure resides on a first semiconductor die that is attached to the first semiconductor die.

11. A method for operating non-volatile memory, the method comprising:
applying a first verify reference voltage to a word line connected to a group of NAND memory cells that are organized as a plurality of bytes, wherein each byte of memory cells is grouped together physically within a block in a three-dimensional memory structure;
sensing the group of memory cells in response to the first verify reference voltage;
selecting a first strict subset of one or more bits in each of a subset of the plurality of bytes of memory cells;
determining a first count of how many of the memory cells in the first strict subset meet a threshold voltage (Vt) criterion with respect to the first verify reference voltage, the first count being based on the sensing of the first strict subset;
responsive to the first strict subset meeting the criterion with respect to the first verify reference voltage:
selecting a second strict subset of one or more bits in each of the subset of the plurality of bytes of memory cells; and
determining a second count how many of the memory cells in the second strict subset meet the Vt criterion with respect to the first verify reference voltage, the second count being based on the sensing of the second strict subset;
applying a second verify reference voltage to the word line connected to the group of memory cells;
sensing the group of memory cells in response to the second verify reference voltage;
determining a third count of how many of the memory cells in the first strict subset meet a Vt criterion with respect to the second verify reference voltage; and
responsive to the first strict subset not meeting the Vt criterion with respect to the second verify reference voltage: omitting counting of how many of the memory cells in the second strict subset meet the Vt criterion with respect to the second verify reference voltage.

12. The method of claim 11, further comprising:
selecting the first strict subset of memory cells and the second strict subset of memory cells based on a difference between a first programming speed of the first strict subset and a second programming speed of the second strict subset.

13. The method of claim 11, further comprising:
selecting the first strict subset of memory cells and the second strict subset of memory cells based on a difference in a first distance of the first strict subset from an edge of the block in a bitline direction and a second distance of the second strict subset from the edge of the block.

14. The method of claim 11, further comprising:
selecting a slower programming group for the first strict subset and a faster programming group for the second strict subset; and
determining whether program verify has passed based on the first count and further on the second count.

15. The method of claim 11, further comprising:
selecting a faster programming group for the first strict subset and a slower programming group for the second strict subset; and
determining whether to initiate program verify for a first data state having a higher reference voltage than a second data state presently being verified based on the first count and further on the second count.

16. A non-volatile storage system, comprising:
a three-dimensional memory structure comprising blocks of memory cells arranged as NAND strings, the three-dimensional memory structure having bit lines extending over the blocks; and
one or more control circuits in communication with the three-dimensional memory structure, the one or more control circuits configured to:
apply a verify reference voltage to a group of memory cells in a selected block in the three-dimensional memory structure;
perform a first bitscan of a first strict subset of the group of memory cells that each have a first distance in a bit line direction from an edge of the selected block; and
perform a second bitscan of a second strict subset of the group of memory cells that each have a second distance in the bit line direction from the edge of the selected block responsive to a condition being met with respect to the first bitscan, wherein the second bitscan is not performed if the condition is not met.

17. The non-volatile storage system of claim 16, wherein the one or more control circuits are further configured to:
select the first strict subset for the first bitscan and the second strict subset for the second bitscan based on a first programming speed of the first strict subset and a second programming speed of the second strict subset.

18. The non-volatile storage system of claim 17, wherein the one or more control circuits are further configured to:
   select a slower programming group for the first strict subset for the first bitscan and a faster programming group for the second strict subset for the second bitscan; and
   determine whether program verify has passed based on the first bitscan and further on the second bitscan when the second bitscan is performed.

19. The non-volatile storage system of claim 17, wherein the one or more control circuits are further configured to:
   select a faster programming group for the first strict subset for the first bitscan and a slower programming group for the second strict subset for the second bitscan; and
   determine, based on the first count and further on the second count when the second bitscan is performed, whether to initiate on a next program loop verify for a data state that is verified with a higher reference voltage than the verify reference voltage that was applied to the group.

20. The non-volatile storage system of claim 16, wherein:
   the first strict subset of memory cells comprises a first group of one or more bits in each of a plurality of bytes of memory cells, wherein each byte of memory cells is grouped together physically; and
   the second strict subset of memory cells comprises a second group of one or more bits in each of the plurality of bytes of memory cells.

* * * * *